United States Patent [19]
Lotfi

[11] Patent Number: 5,654,645
[45] Date of Patent: Aug. 5, 1997

[54] BUFFER WITH CONTROLLED HYSTERESIS

[75] Inventor: Younes Lotfi, Round Rock, Tex.

[73] Assignee: Cypress Semiconductor Corp., San Jose, Calif.

[21] Appl. No.: 507,849

[22] Filed: Jul. 27, 1995

[51] Int. Cl.$^6$ ................... H03K 19/0948; H03K 17/16
[52] U.S. Cl. ................ 326/24; 326/32; 326/34; 326/83; 327/206; 327/513
[58] Field of Search ................... 326/31–34, 83, 326/86–87, 112, 119, 121, 23–24; 327/205–206, 187, 513

[56] References Cited

U.S. PATENT DOCUMENTS

| | | | |
|---|---|---|---|
| 5,334,883 | 8/1994 | Rosenthal | 327/206 |
| 5,336,942 | 8/1994 | Khayat | 327/206 |
| 5,341,033 | 8/1994 | Koker | 327/206 |
| 5,349,246 | 9/1994 | McClure | 326/121 |
| 5,369,311 | 11/1994 | Wang et al. | 327/292 |
| 5,399,960 | 3/1995 | Gross | 323/313 |

*Primary Examiner*—Edward P. Westin
*Assistant Examiner*—Jon Santamauro
*Attorney, Agent, or Firm*—Blakely, Sokoloff, Taylor & Zafman LLP

[57] ABSTRACT

A method and apparatus that controls and modulates the amount of hysteresis in a buffer in response to changes in operating conditions. The buffer comprises a first stage switching element and a hysteresis control element. The first stage switching element is configured to have a DC voltage trip point. As an input voltage, transitioning from a first state to a second state, is applied to the first stage switching element, the first stage switching element transitions as the input voltage reaches the DC voltage trip point. The transition of the first stage switching element enables the hysteresis control element to provide a feedback path biasing the first stage switching element. Consequently, as the input voltage transitions from the second logic level to the first logic level, the first stage switching element transitions at a voltage level offset from the DC trip point to provide hysteresis in the buffer. The hysteresis control element further controls and modulates the amount of hysteresis in the buffer such that when the buffer is operating under high noise conditions, the hysteresis in the buffer is a maximum amount and when the buffer is operating under low noise conditions, the hysteresis in the buffer is a minimum amount. Alternatively, the hysteresis control element, in addition to the maximum and minimum hysteresis amounts, provides an intermediate amount of hysteresis when the buffer is operating under an intermediate noise condition.

40 Claims, 11 Drawing Sheets

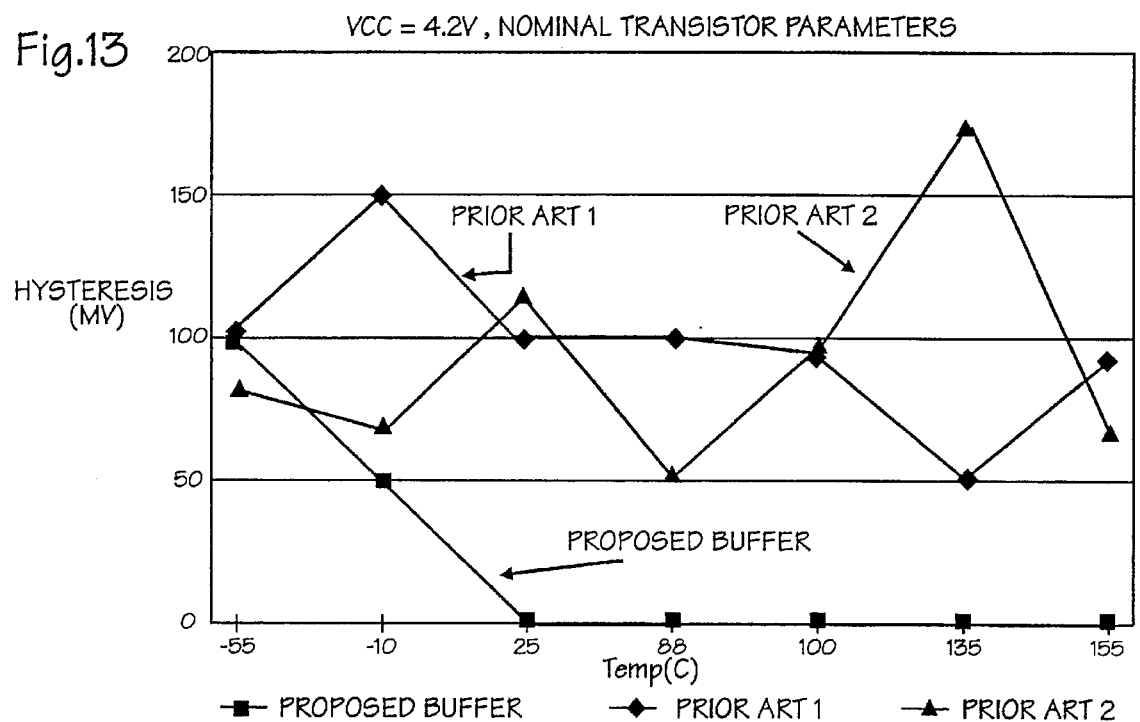
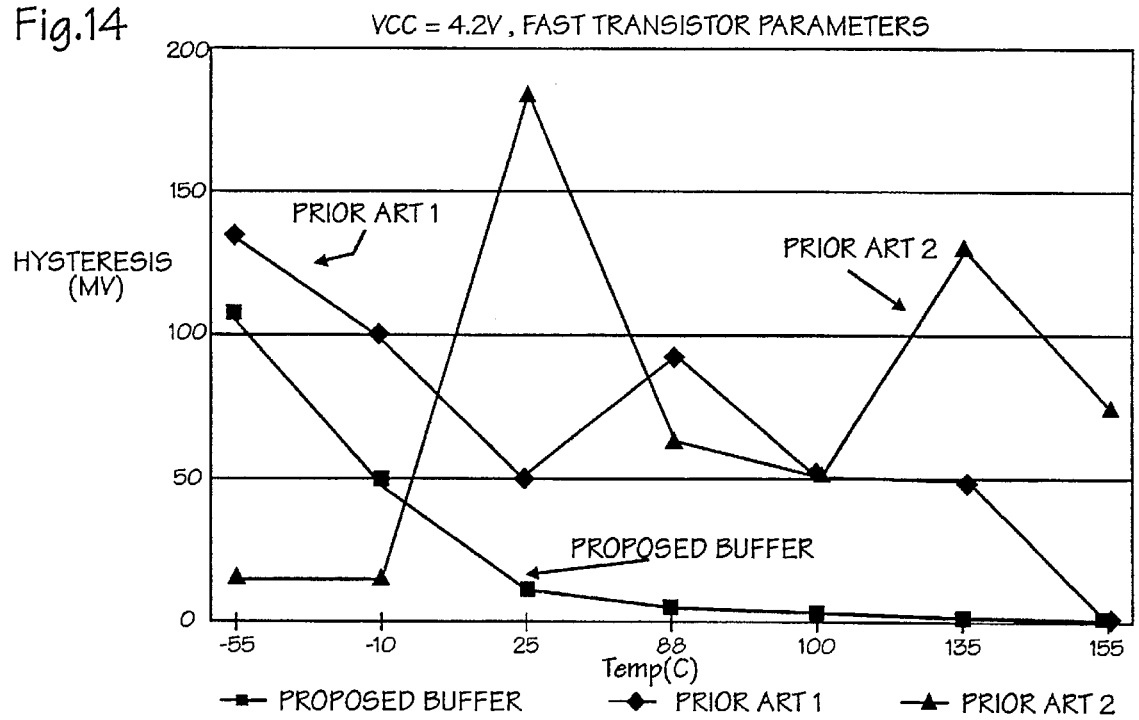

BUFFER WITH CONTROLLED HYSTERESIS

BACKGROUND OF THE INVENTION

1. Field of the Invention

The present invention relates to a buffer, and in particular to a method and apparatus that controls and modulates the amount of hysteresis in a buffer in response to changes in the operating conditions.

2. Art Background

In the design of digital circuits, the noise immunity of the circuit must be considered. Noise in a digital circuit or system can cause, for example, a switching circuit to erroneously transition from one logic level to another. A significant contributor to noise experienced by a digital circuit is on-chip generated noise. On-chip generated noise can be produced by the switching of output drivers which cause voltage spikes on the power supply busses. In addition, the operating conditions of the digital circuit can increase or reduce the amount of noise generated. High noise operating conditions, that is, operating conditions which comprise fast transistor parameters (such as high conductance), high power supply voltages and low operating temperatures, increase the incidence of on-chip generated noise. Conversely, low noise operating conditions, that is, operating conditions which comprise slow transistor parameters (such as low conductance), low power supply voltages and high operating temperatures, reduce the incidence of on-chip generated noise.

To reduce the negative effects of noise in a digital buffer circuit, hysteresis is often employed. Hysteresis provides a buffer with a degree of noise immunity at the expense of introducing a constant delay into the speed of the buffer circuitry. A switching buffer with hysteresis will transition from a first logic state to a second logic state as an input signal applied to the buffer reaches a predetermined voltage level called the direct current (DC) trip point. To transition the switching buffer back from the second logic state to the first logic state the input signal transitions at a voltage offset from the DC trip point. The difference in transition points is the amount of hysteresis in the circuit and provides the switching buffer with noise immunity and reduces the occurrence of erroneous switching. However, the circuit elements that produce hysteresis in the switching buffer also introduce a delay into the switching speed of the buffer. The hysteresis delay is present whether the switching buffer is operating under high noise operating conditions where hysteresis is needed, low noise operating conditions where hysteresis is not needed, or any operating point in between where some degree of hysteresis is needed.

FIG. 1 illustrates a switching circuit with hysteresis commonly referred to as a Schmitt Trigger. The circuit contains a complimentary metal oxide semiconductor (CMOS) NOR gate with input signals VIN and LOW POWER. The CMOS NOR gate has p-channel MOSFETs 2 and 4 coupled to n-channel MOSFETs 6, 8 and 14. A feedback n-channel MOSFET 10 is coupled to the out-put 12 of the CMOS NOR gate. CMOS current buffers (shown as inverters) 16 and 18 are coupled to out-put 12. CMOS inverters 16 and 20 provide VOUT' and VOUT. When the LOW POWER signal is a low logic level, hysteresis is provided by the n-channel MOSFETs 8 and 10. As VIN transitions from a high logic level to a low logic level the CMOS NOR gate transitions at a predetermined DC trip point. As VIN transitions from a low logic level to a high logic level n-channel MOSFETs 8 and 10 increase the source voltage on transistor 6 which will effectively raise the high logic level DC trip point.

FIG. 2 illustrates a second technique for generating hysteresis in a buffer circuit. Again, the circuit contains a CMOS NOR gate having inputs VIN and LOW POWER. The CMOS NOR gate has p-channel MOSFETs 40 and 44 coupled to n-channel MOSFETs 46 and 48. A p-channel MOSFET 42 is coupled to p-channel MOSFET 40. CMOS inverter 50 is coupled is coupled to output VOUT, provides VOUT and enables p-channel MOSFET 42. When the LOW POWER signal is a low logic level, hysteresis is provided when VIN transitions from a high logic level to a low logic level at a predetermined DC trip point. This causes CMOS inverter 50 to transition and enable p-channel transistor 42. As VIN transitions from a high logic level to a low logic level p-channel MOSFET 42 produces a voltage transition point greater than the DC trip point.

In the prior art circuits illustrated in FIG. 1 and FIG. 2, hysteresis is present whenever the buffer is enabled. Therefore these circuits introduce delays in the operating speeds of the buffers regardless of whether the operating conditions of the buffer comprise high noise operating conditions, low noise operating conditions, or intermediate noise operating conditions. Therefore the buffers with hysteresis suffer a speed penalty by employing hysteresis during operating conditions when it is not required. Moreover, these circuits cannot detect and control the amount of hysteresis in the buffer as a function of variations in operating conditions.

SUMMARY OF THE INVENTION

Therefore, it is desirable to provide a method and apparatus that controls and modulates hysteresis in a buffer in response to variations in operating conditions.

The foregoing is accomplished by a method and apparatus in a buffer which detects when high noise operating conditions and low noise operating conditions are present. The method and apparatus increase the hysteresis of the buffer to a maximum amount when the high noise operating conditions are present. Performance of the buffer is not impacted because the device operates at its fastest when high noise conditions are present. The method and apparatus additionally reduce hysteresis to a minimum when low noise operating conditions are present and hysteresis is not required. Therefore, the speed penalty associated with hysteresis is eliminated when hysteresis is not required. Alternatively, the method and apparatus detects, in addition to the high and low noise operating conditions, the occurrence of one or more intermediate noise operating conditions and modulates hysteresis to values intermediate of the maximum and minimum hysteresis values.

The present invention has two functional blocks. The first functional block is a first stage switching element such as a CMOS NOR gate or inverter which inverts an input voltage signal. The second functional block is a hysteresis control element which provides a feedback path to the first stage switching element. The hysteresis control element controls the hysteresis of the buffer in response to variations in the operating conditions, such that when the buffer is operating under high noise conditions the hysteresis of the buffer is increased to a maximum value to provide greater noise immunity. When the buffer is operating under low noise conditions the hysteresis of the buffer is reduced to a minimum value to eliminate the speed penalty associated with the delay caused by the hysteresis control element. Alternatively, the hysteresis control element provides, in addition to the maximum and minimum amount of hysteresis, at least one intermediate level of hysteresis when the buffer is operating under conditions which generate intermediate levels of noise. Additionally, the present invention, may alternatively comprise a third functional block. The third functional block is a second stage switching element such as a CMOS inverter which is coupled to both the first stage switching element and the hysteresis control element. The second stage switching element controls when the hysteresis control element provides hysteresis for the buffer.

One embodiment of the present invention comprises a first stage switching element having a first DC trip point, a second stage switching element having a second DC trip point and a hysteresis control element. The hysteresis control element comprises two n-channel MOSFETs coupled in series. The n-channel MOSFETs couple the output of the first stage switching element to reference voltage VSS. The first n-channel MOSFET is controlled by the output of the second stage switching element such that when the second stage switching element outputs a high logic level then the first n-channel MOSFET turns on. The second n-channel MOSFET is controlled by a reference voltage generator. The reference voltage generator produces a predictable controlled voltage which is dependent upon the operating conditions of the buffer.

Hysteresis is generated when an input voltage applied to the first stage switching element transitions from a low logic level to a high logic level. When the input reaches the first DC trip point of the first stage switching element the first stage switching element transitions from a high logic level to a low logic level resulting in the transition of the second stage switching element from a low logic level to a high logic level. With a high logic level applied to the first n-channel MOSFET, a feedback path will exist when the second n-channel MOSFET is on. With the second n-channel MOSFET on, the first and second n-channel MOSFETs generate a low logic level at the output of the first stage switching element. When the input voltage transitions from the high logic level to the first DC trip point of the first stage switching element, the first stage switching element will not transition because of the feedback path. Therefore, the input voltage must be lowered to a level below the first DC trip point in order to transition the second stage switching element from a high logic level to a low logic level and turn the second n-channel MOSFET off thus eliminating the feedback path. The amount that the input voltage is offset from the first DC trip point as the input voltage transitions from a high logic level to a low logic level after transitioning from a low logic level to a high logic level, is the hysteresis amount.

When the buffer is operating under a high noise condition, the reference voltage generator outputs a voltage level that is greater than the threshold voltage of the second n-channel MOSFET thus providing a high conductance path in series with the first n-channel MOSFET. As long as the second stage switching element provides a high logic level to the first n-channel MOSFET a feedback path is created to the first stage switching element and hysteresis in the buffer is increased to a maximum. When the buffer is operating under a low noise condition, the reference voltage generator outputs a voltage level that is less than the threshold voltage of the second transistor thus providing a low conductance path in series with the first n-channel MOSFET. This effectively removes the feedback path to the first stage switching element and reduces hysteresis in the buffer to a minimum. Therefore hysteresis is minimized at the low noise operating condition where it is not required and where it would introduce an unnecessary speed penalty into the buffer. Finally, when the buffer is operating under conditions which are intermediate of high and low noise conditions the reference voltage generator outputs voltages which are greater than the threshold voltage of the second n-channel MOSFET but less than the maximum voltage output by the reference voltage generator during high noise conditions. The intermediate output voltages control the conductance of the second n-channel MOSFET and thus control the conductance of the feedback path to the first stage switching element. As operating conditions become more noisy, the second n-channel MOSFET provides a more conductive path in series with the first n-channel MOSFET resulting in more hysteresis in the buffer. As operating conditions become less noisy, the second n-channel MOSFET provides a less conductive path in series with the first n-channel MOSFET resulting in less hysteresis in the buffer.

BRIEF DESCRIPTION OF THE DRAWINGS

The feature and advantages of the present invention will be apparent from the following detailed description of the preferred embodiment of the invention with references to the following drawings.

FIG. 13 is a graph which illustrates the amount of hysteresis present in the circuit diagrams of FIGS. 1, 2 and 10 as a function of temperature when the circuits operate at low power supply voltage and nominal transistor parameters.

FIG. 14 is a graph which illustrates the amount of hysteresis present in the circuit diagrams of FIGS. 1, 2 and 10 as a function of temperature when the circuits operate at low power supply voltage and fast transistor parameters.

DETAILED DESCRIPTION

Figure 1:
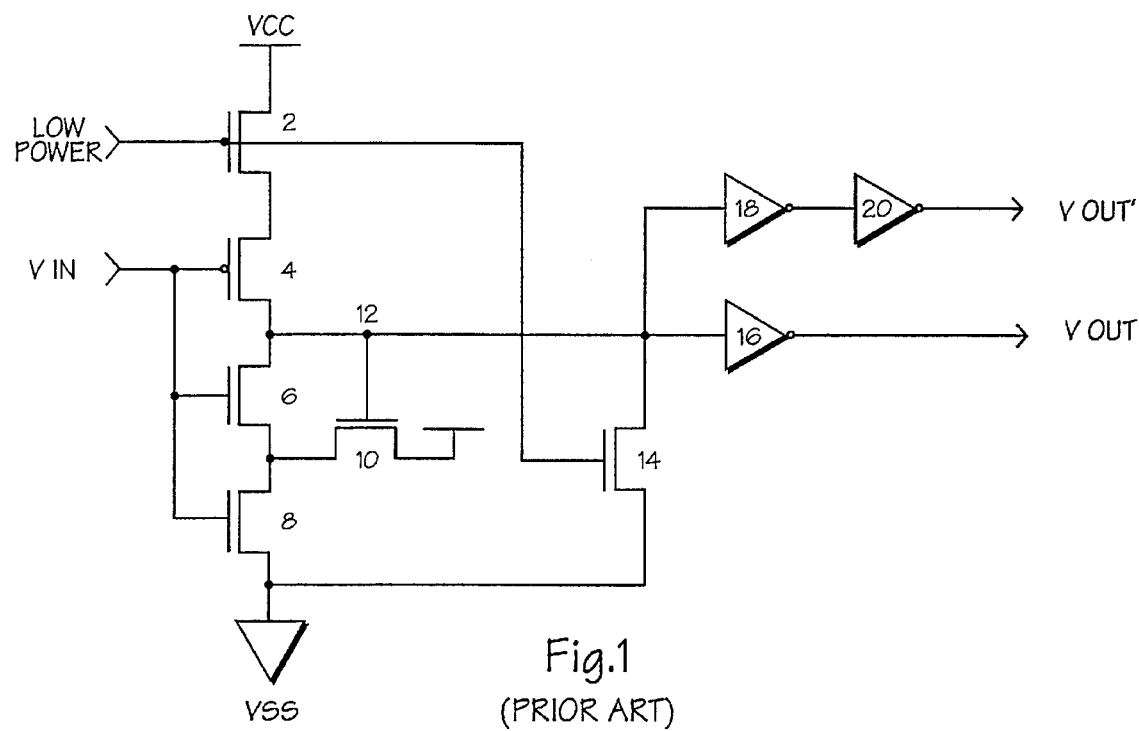
FIG. 1 illustrates a conventional prior art circuit implementation of a buffer with hysteresis.

A buffer with controlled hysteresis is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily. In addition, in the accompanying figures, n-channel ("NMOS") transistors are illustrated as shown by transistor 6 in FIG. 1. The p-channel ("PMOS") transistors are illustrated as shown by transistor 2 in FIG. 1. All the transistors in the embodiments shown herein are enhancement mode devices. In the normal use of the invention, a power supply voltage is provided at the VCC connection shown in the figures. Typically, VCC is maintained at +5 volts. Also, in the normal use of the invention, the VSS connection shown in the figures is maintained at ground. Of course, other voltages may be utilized by those skilled in the art for VCC and VSS.

Figure 3:
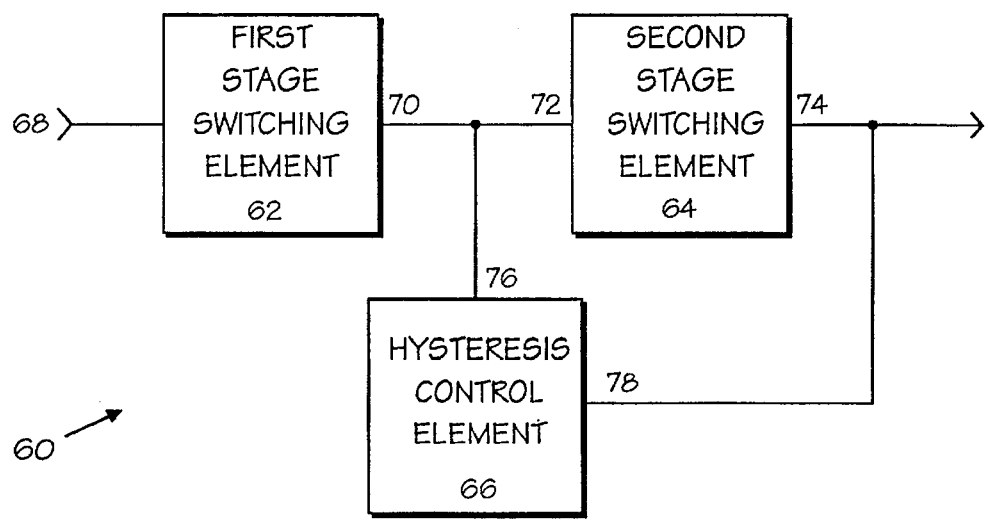
FIG. 3 illustrates a block diagram of one embodiment of the buffer with modulated hysteresis.

Referring to FIG. 3, a block diagram of one embodiment of the present invention is shown. As FIG. 3 shows, the buffer with controlled hysteresis 60 has three functional blocks: a first stage switching element 62, a second stage switching element 64, and a hysteresis control element 66. The first stage switching element 62 has two terminals. The first terminal 68 is an input terminal and accepts an input signal to the buffer. The second terminal 70 is an output terminal. The second stage switching element 64 also has two terminals. The first terminal is an input terminal 72 which is coupled to output terminal 70. The second terminal is an output terminal 74 which provides a signal which is the inverse of an input signal provided at input terminal 72. The first stage switching element 62 is coupled to second stage switching element 64 such that a transition of the first stage switching element 62 results in a transition in the second stage switching element 64. The first stage switching element 62 and the second stage switching element 64 may comprise any digital switching circuitry such as a NOR gate or an inverter. A preferred embodiment of the switching elements is described below. The third functional block is the hysteresis control element 66 which has two terminals. The first terminal 78 is coupled to the output terminal 74 of the second stage switching element 64. The second terminal 76 is coupled to the both the output terminal 70 of the first stage switching element 62 and the input terminal 72 of the second stage switching element 64. The hysteresis control element 66 provides a feedback path which generates hysteresis in the buffer.

The first stage switching element 62 is configured to have a first direct current (DC) voltage trip point, and the second stage switching element 64 is configured to have a second DC voltage trip point. Hysteresis is generated when an input voltage transitions from a first logic state to a second logic state transitioning the first stage switching element 62 as the input voltage reaches the first DC trip point. When the first stage switching element 62 transitions, the second stage switching element 64 will transition at the second DC trip point and enable the hysteresis control element 66 to provide a feedback path. The feedback path generates a first voltage at the output terminal 70 of the first stage switching element 62. As the input voltage to the first stage switching element 62 transitions back from the second logic state to the first logic state, the first stage switching element 62 does not transition at the first DC trip point because the hysteresis control element 66 continues to provide a feedback path which produces a second voltage at the input terminal 72 of the second stage switching element 64. The second voltage is offset from the second DC trip point of the second stage switching element 64 resulting in the second stage switching element 64 not transitioning. Therefore, the input voltage to the first stage switching element 62 must be offset from the first DC trip point to an offset voltage level in order to transition the first stage switching element 62 and cause the hysteresis control element to generate a third voltage at the input to the second stage switching element 62 equal to the second DC trip point. This allows the second stage switching element 64 to disable the feedback path. The difference between the offset voltage level and the first DC trip point is the hysteresis value of the buffer which will vary in response to operating conditions.

In a predictable and controlled fashion, the hysteresis control element 66 controls and modulates the amount of hysteresis in response to variations in the operating conditions of the buffer. In particular, when the buffer is operating under a high noise condition (high power supply voltage, cold temperatures, fast transistor parameters) the hysteresis control element produces a maximum amount of hysteresis in the buffer; when the buffer is operating under a low noise condition (low power supply voltage, high temperatures, slow transistor parameters) the hysteresis control element produces a minimum amount of hysteresis in the buffer. Alternatively, when the buffer is operating under conditions which produce noise intermediate of those levels generated under the high and low noise operating conditions, the hysteresis control element produces an intermediate amount of hysteresis in the buffer. It will be appreciated that the present invention may be utilized in all digital circuits which utilize hysteresis for noise immunity including static random access memories (SRAMs), dynamic random access memories (DRAMs) and microcontrollers.

Figure 4:
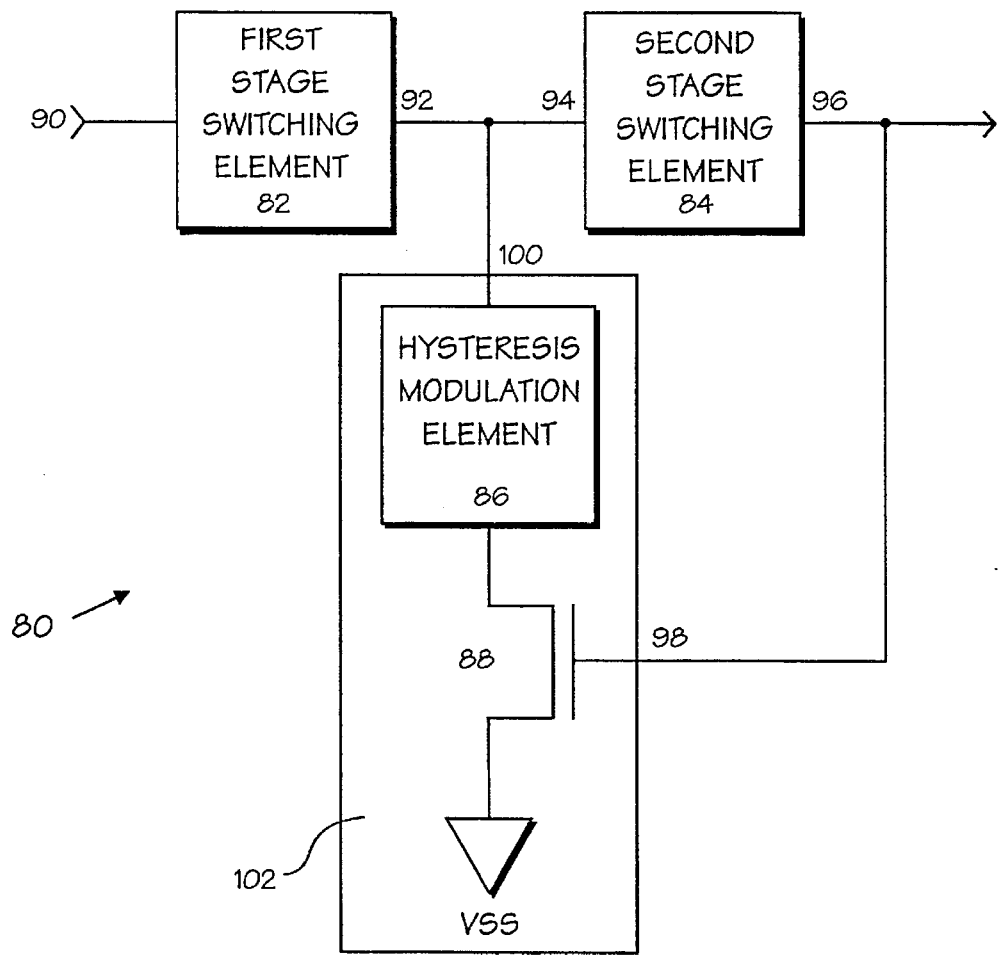
FIG. 4 illustrates a block diagram of a second embodiment of the buffer with modulated hysteresis.

FIG. 4 illustrates a second embodiment of the present invention which shows a more detailed embodiment of the hysteresis control element. As in FIG. 3, the buffer 80 in FIG. 4 comprises a first stage switching element 82 having a first DC trip point coupled to a second stage switching element 84 having a second DC trip point, and a hysteresis control element 102 coupled to both switching elements. The hysteresis control element 102 comprises a first terminal 98 coupled to the second stage switching element 84, and a second terminal 100 coupled to the first stage switching element 82. The hysteresis control element further comprises a hysteresis modulation element 86 having variable conductance coupled in series with a third stage switching element 88 to form a serial connection. The serial connection couples the output terminal 92 to reference voltage VSS. As illustrated in FIG. 4, the third stage switching element may comprise an n-channel MOSFET with its gate coupled to output terminal 96 of second stage switching element 84 such that second stage switching element 84 controls the conductance of n-channel MOSFET 88. FIG. 4 illustrates that the source of n-channel MOSFET 88 is coupled to VSS and the drain is coupled to hysteresis modulation element 86; however, the location of hysteresis modulation element 86 and n-channel MOSFET 88 in the serial connection may be switched such that hysteresis modulation element 86 is coupled to VSS, the source of n-channel MOSFET 88 is coupled to hysteresis modulation element 86 and the drain of n-channel MOSFET 88 is coupled to output terminal 92 of first stage switching element 82.

Hysteresis is generated as an input signal applied to the first stage switching element 82 transitions from a low logic level to a high logic level the first stage switching element 82 will transition from a high logic level to a low logic level. The first stage switching element 82 will transition when the input signal reaches the first DC trip point of the first stage switching element 82. This will cause the second stage switching element 84 to transition at its second DC trip point from a low logic level to a high logic level and bias n-channel MOSFET 88 into saturation. If the hysteresis modulation element 86 provides a conductive path, then a feedback path will exist and the hysteresis control element 102 will generate a low logic level at second terminal 100. As the input voltage transitions from a high logic level to the first DC trip point the hysteresis control element 102 will generate a second voltage at second terminal 100 which is less than the second DC trip point of second stage switching element 84. Therefore, the input voltage must transition to an offset voltage which is less than the first DC trip point. When the input voltage reaches the offset voltage, the hysteresis control element generates a voltage equal to the second DC trip point of the second stage switching element 84 which causes the second stage switching element to transition. This disables n-channel MOSFET 88 and eliminates the feedback path. The difference between the offset voltage level and the first DC trip point is the amount of hysteresis in the buffer.

The hysteresis modulation element 86 may comprise a switch such that when the buffer is operating under a high noise condition, hysteresis modulation element 86 closes thus providing a high conductance path in series with n-channel MOSFET 88. When second stage switching element 84 enables n-channel MOSFET 88, a feedback path exists which will increase the hysteresis in the buffer to a maximum amount. This introduction of hysteresis produces desirable noise immunity with minimal reduction in speed because the switching stages operate at increased speeds under high noise conditions. Conversely, when the buffer is operating under a low noise condition, hysteresis modulation element 86 opens thus providing a low conductance path in series with n-channel MOSFET 88. In this configuration, no feedback path is provided and the hysteresis of the buffer is reduced to a minimum amount. This is true regardless of whether the second stage switching element turns n-channel MOSFET 88 on or off. Thus, under a low noise condition, the speed delay associated with prior art buffers with hysteresis circuitry is eliminated.

Alternatively, the hysteresis modulation element with variable conductance 86 modulates the amount of hysteresis in the buffer in response to intermediate noise operating conditions, as well as, high and low noise operating conditions. The intermediate noise operating conditions may comprise one intermediate condition or a variable number. When the buffer is operating under one of the intermediate operating conditions, the hysteresis modulation element modulates its conductance accordingly to control the amount of hysteresis in the buffer in a predictable and specific manner. For example, when the buffer is operating under conditions which comprise a high power supply voltage, cold temperatures but slow transistor parameters, the conductance of the hysteresis modulation element is modulated to an amount less than that of the high noise operating condition, but greater than the conductance at the low noise operating condition. This results in an amount of hysteresis which is intermediate of the maximum and minimum values generated under the high and low noise operating conditions respectively.

Figure 5:
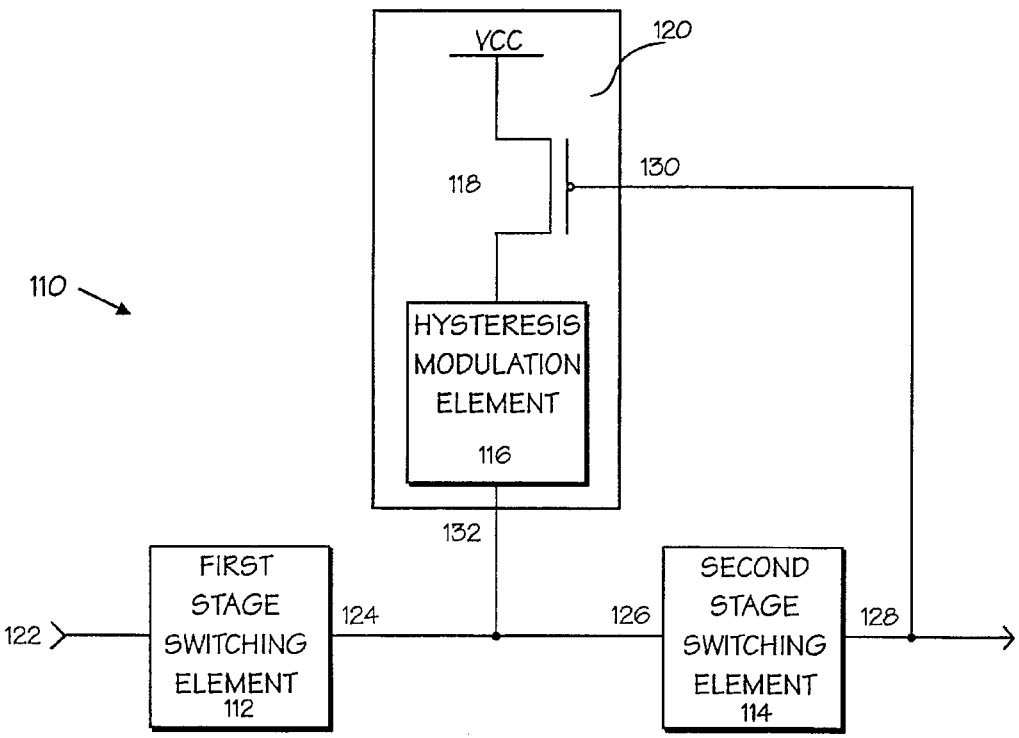
FIG. 5 illustrates a block diagram of a third embodiment of the buffer with modulated hysteresis.

Referring now to FIG. 5, a third embodiment of the present invention is illustrated. The buffer 110 is similar to the buffer 80 illustrated in FIG. 4 except that the hysteresis control element 120 comprises a third stage switching element 118 coupled to the hysteresis modulation element 116. The third stage switching element illustrated in FIG. 5 comprises a p-channel MOSFET. The p-channel MOSFET 118 is coupled to and controlled by the second stage switching element 114. Again, the hysteresis modulation element 116 and the p-channel MOSFET 118 are coupled in series, in any order, to provide a feedback path. The operation of the buffer 110 is analogous to the operation of buffer 80 of FIG. 4, except that hysteresis is generated as an input voltage, applied to the first stage switching element 112, transitions from a low logic level to a high logic level after transitioning from a high logic level to a low logic level.

Figure 6:
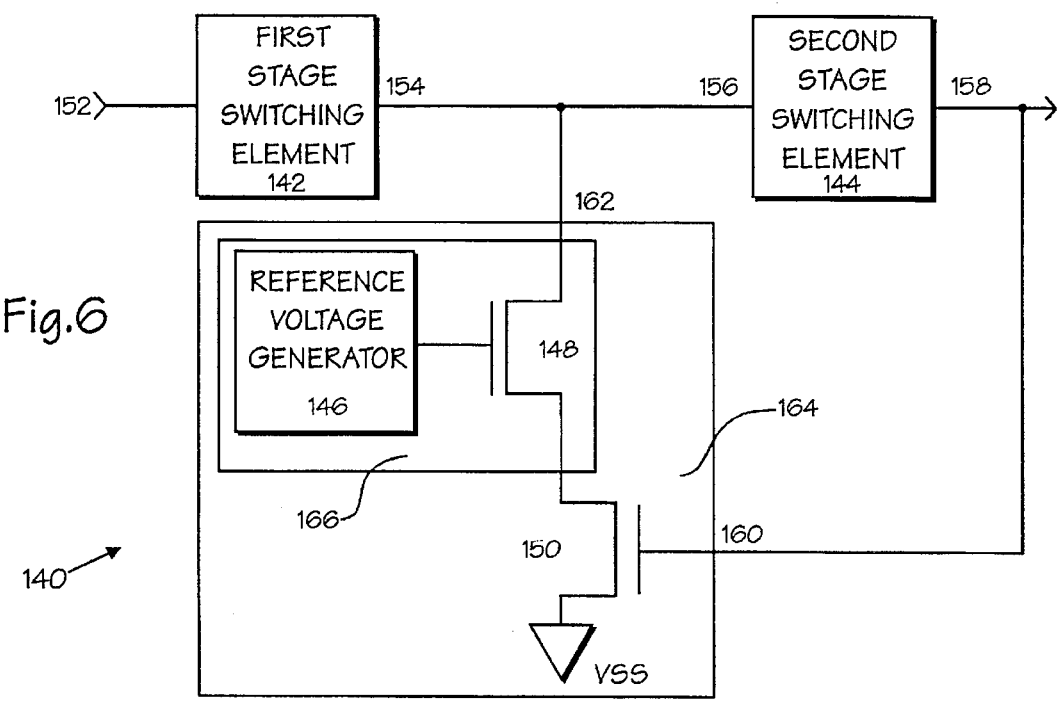
FIG. 6 illustrates a circuit diagram of a fourth embodiment of the buffer with modulated hysteresis.

FIG. 6 illustrates a fourth embodiment of the present invention which shows a more detailed embodiment of the hysteresis modulation element. The buffer 140 of FIG. 6 comprises first stage switching element 142 having a first DC trip point, a second stage switching elements 144 having a second DC trip point and a hysteresis control element 164. The hysteresis control element 164 has a first terminal 160 coupled to the second stage switching element 144 and a second terminal 162 coupled to the first stage switching element 142. The hysteresis control element comprises a hysteresis modulation element 166 having variable conductance coupled to a third stage switching element 150. The hysteresis modulation element 166 further comprises a reference voltage generator 146 coupled to a fourth stage switching element 148. The third and fourth stage switching elements 150 and 148 are coupled in series to form a serial connection. The serial connection couples the output terminal 154 of the first stage switching element 142 to reference voltage VSS. It will be appreciated that the placement of the third and fourth stage switching elements in the serial connection may be interchanged. The third and fourth stage switching elements illustrated in FIG. 6 comprise n-channel MOSFETs 150 and 148 respectively. The gate of fourth n-channel MOSFET 148 is coupled to and controlled by the reference voltage generator 146.

As in FIG. 4, hysteresis is generated as the input voltage transitions from a high logic level to a low logic level after transitioning from a low logic level to a high logic level. Additionally, as in FIG. 4, the hysteresis modulation element 166 may operate as a switch such that when the buffer is operating under a high noise condition, the reference voltage generator 146 provides a high voltage greater than threshold voltage of n-channel MOSFET 148, turning on n-channel MOSFET 148 and providing a high conductance path in series with the n-channel MOSFET 150. When the second stage switching element 144 enables n-channel MOSFET 150 a feedback path exists which will increase the amount of hysteresis in the buffer to a maximum amount. Conversely, when the buffer is operating under a low noise condition, the reference voltage generator 146 provides a voltage below the threshold voltage of n-channel MOSFET 148, turning off n-channel MOSFET 148 and providing a low conductance path in series with the n-channel MOSFET 150. In this configuration, no feedback path is provided and the hysteresis of the buffer is reduced to a minimum amount. This is true regardless of whether the second stage switching element turns n-channel MOSFET 150 on or off. Thus, under a low noise condition, the speed delay associated with the hysteresis generation is eliminated.

Alternatively, the hysteresis modulation element with variable conductance 166, modulates the amount of hysteresis in the buffer in response to intermediate noise operating conditions, as well as, high and low noise operating conditions. The intermediate noise operating conditions may comprise one intermediate condition or a variable number. When the buffer is operating under one of the intermediate operating conditions, the reference voltage generator 146 provides a voltage intermediate of the high and low voltages provided under high and low noise conditions respectively. The intermediate voltage modulates the conductance of n-channel MOSFET 148 to a value intermediate of its high and low conductance values and accordingly controls the amount of hysteresis in the buffer in a predictable and specific manner. For example, when the buffer is operating under conditions which comprise a high power supply voltage, cold temperatures but slow transistor parameters, the conductance of the n-channel MOSFET 148 is modulated to an amount less than that of the high noise operating condition, but greater than the amount of the low noise operating condition resulting in an amount of hysteresis which is intermediate of the maximum and minimum values generated under the high and low noise operating conditions respectively.

Figure 7:
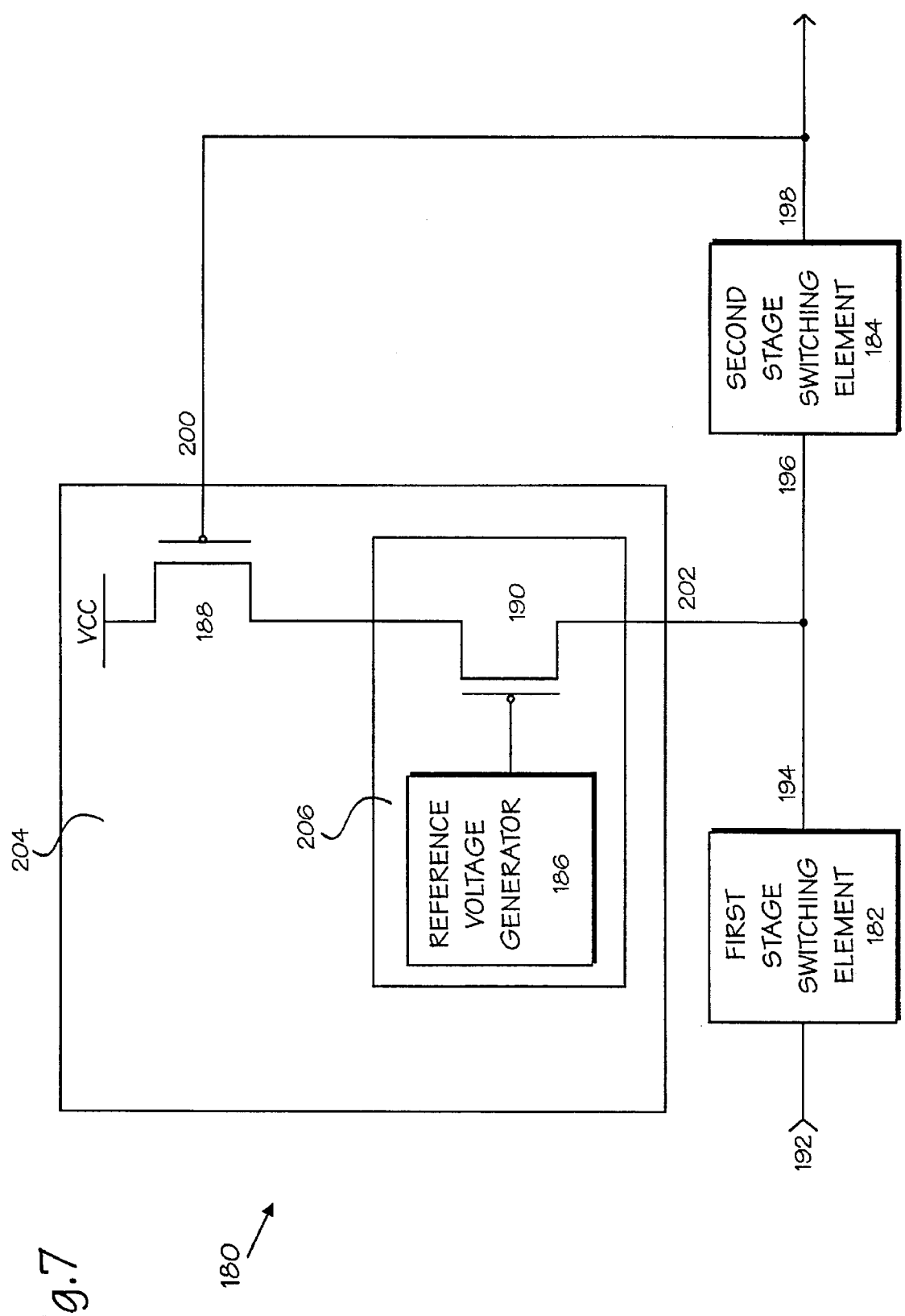
FIG. 7 illustrates a circuit diagram of a fifth embodiment of the buffer with modulated hysteresis.

Referring now to FIG. 7, a fifth embodiment of the present invention is illustrated. The buffer 180 is similar to the buffer 140 illustrated in FIG. 6 except that the hysteresis control element 204 comprises a third stage switching element 188 coupled to the hysteresis modulation element 206. The hysteresis modulation element 206 comprises a fourth stage switching element 190 coupled to a reference voltage generator 186. The third and fourth stage switching elements 188 and 190 illustrated in FIG. 7 comprise p-channel MOSFETs. P-channel MOSFET 188 is coupled to and controlled by the second stage switching element 184, while the gate of p-channel MOSFET 190 is coupled to and controlled by the reference voltage generator 186. The operation of buffer 180 is analogous to the operation of buffer 140 of FIG. 6, except that hysteresis is generated as an input voltage, applied to first stage switching element 182, transitions from a low logic level to a high logic level after transitioning from a high logic level to a low logic level.

Figure 8:
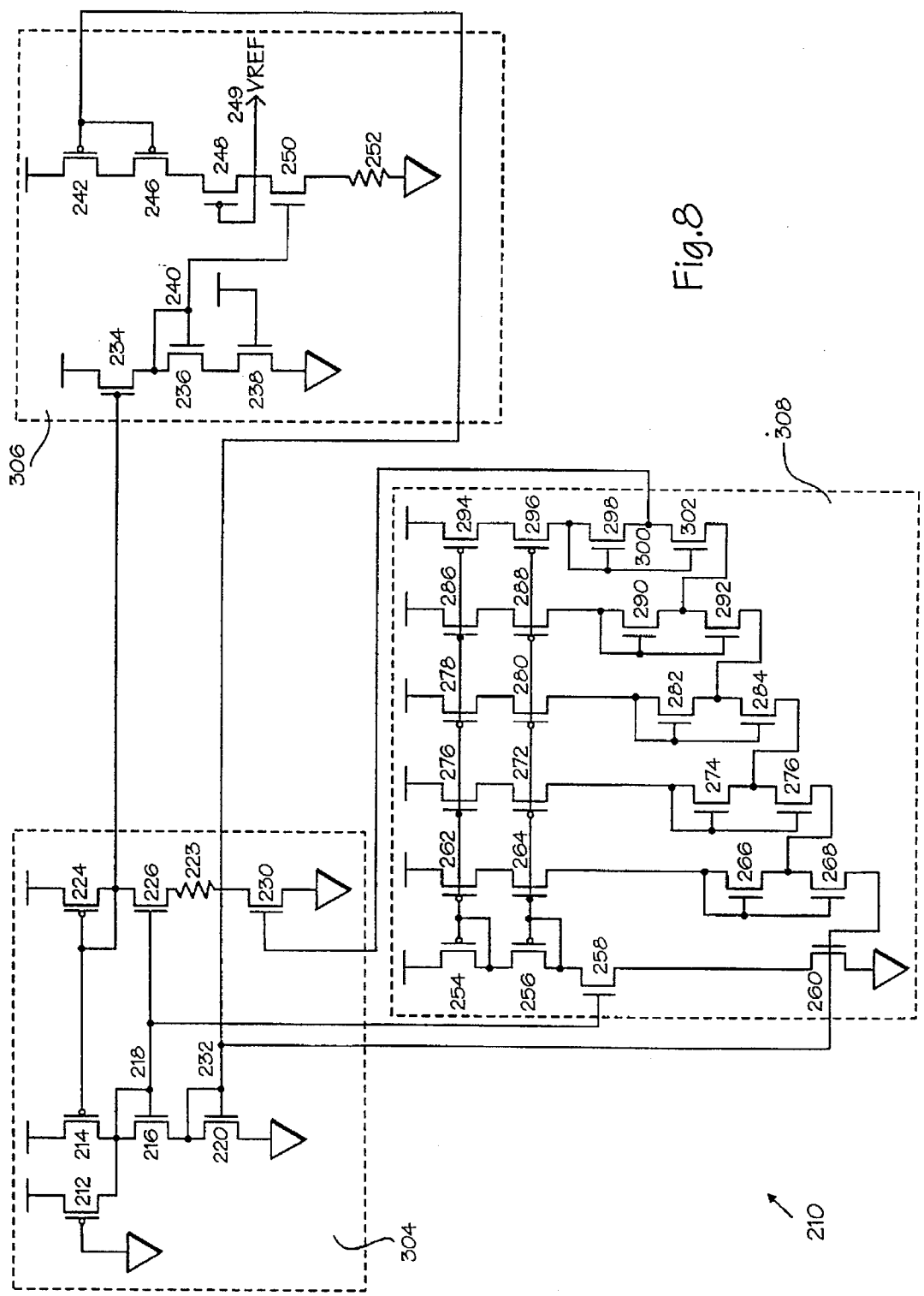
FIG. 8 illustrates a circuit diagram of one embodiment of the reference voltage generator.

One embodiment of the reference voltage generator 146 described in FIG. 6 is detailed in U.S. patent application Ser. No. 08/151,415 issued as U.S. Pat. No. 5,399,960 to Gross which is hereby incorporated by reference. The reference voltage generator produces a reference voltage that varies in a controlled and specific fashion with variations in the noise operating conditions of the buffer. FIG. 8 illustrates one embodiment from Gross. As described in Gross, FIG. 8 shows a reference voltage generator 210 that has two voltage generator circuits which are cascaded. The first voltage generator circuit 304 biases the second voltage generator circuit 306 to produce a reference voltage VREF at output terminal 249. The reference voltage generator circuit of FIG. 8 compensates for the natural response of MOS circuits to changes in variations in the components of which the circuit is constructed, that is, the transistors and resistors. Since the voltage generator circuits have circuit elements that are temperature sensitive, a floating voltage source 308 is coupled to the voltage reference circuit to maintain the required output characteristics. The operation of this floating voltage source is discussed in an article by W. M. Sansen, F. Opteynde, and M. Steyart entitled "A CMOS Temperature-Compensated Current Reference," IEEE Journal of Solid-State Circuits, Vol 23, No. 3, June 1988.

The floating voltage source 308 has a positive temperature coefficient (as temperature increases, the output voltage of the floating voltage source increases) which enables it to increase the reference voltage generator's temperature dependence in a controlled fashion. In addition, in order to produce a reference voltage VREF that varies in a controlled and specific fashion with changes in operating conditions, the reference voltage generator 210 couples a feedback path from the second voltage generator circuit to the first voltage generator circuit at node 232. This feedback path compensates for uncontrolled variations in the reference voltage VREF that are due to variations in the transistor conductance parameters. This feedback path compensates for the variation by adjusting the second voltage generator circuit's voltage response to process variations, to oppose the first voltage generator circuit's voltage response to the same process variations. In other words, the feedback path from the first voltage generator circuit alters the gate bias voltage of a transistor in the second voltage generator circuit to actually reverse the effect of n-channel to p-channel mobility variations.

Therefore, the reference voltage generator of FIG. 8 produces a high output voltage at VREF when it detects that the buffer is operating under a high noise operating condition (high power supply voltage, cold temperatures and fast transistor parameters) thus increasing the hysteresis of the buffer to a maximum value. The reference voltage generator of FIG. 8 also produces a low output voltage at VREF when it detects that the buffer is operating under a low noise operating condition (low power supply voltage, hot temperatures and slow transistor parameters) thus reducing the hysteresis of the buffer to a minimum value. In addition, the reference voltage generator of FIG. 8 produces intermediate voltages at VREF when it detects that the buffer is operating under a noise operating conditions intermediate of the high and low noise operating conditions (e.g. low power supply voltage, hot temperatures and fast transistor parameters) thus modulating the hysteresis of the buffer to a value intermediate of the maximum and minimum hysteresis values.

Figure 9:
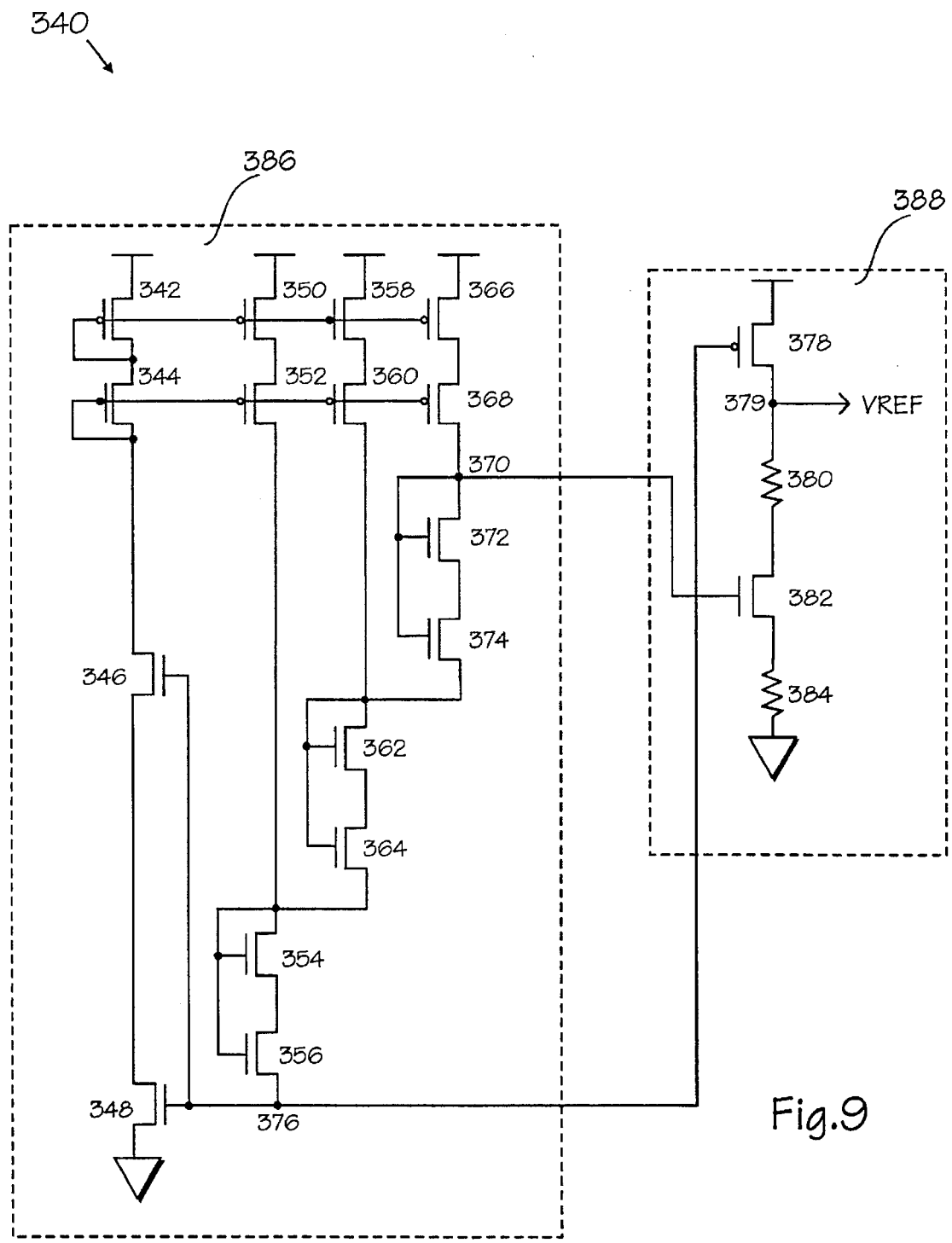
FIG. 9 illustrates a circuit diagram of a second embodiment of the reference voltage generator.

FIG. 9 illustrates another embodiment of a reference voltage generator which produces an output voltage that varies in a controlled and specific fashion in response to variations in operating conditions of the buffer. The reference voltage generator 340 comprises a floating voltage source 386 which biases a voltage generator circuit 388 to produce a reference voltage VREF at output terminal 379. As in FIG. 8, the reference voltage generator 340 compensates for the natural response of MOS circuits to changes in variations in the components of which the circuit is constructed. The floating voltage source 386 operates in the same fashion as floating source 308 of FIG. 8, that is, the floating voltage source has a positive temperature coefficient that enables it to increase the reference voltage generator's temperature dependence in a controlled fashion. Thus, when the buffer is operating under a high noise condition, the voltages at nodes 370 and 376 decrease which cause n-channel MOSFET 382 to be less conductive and p-channel MOSFET 378 to be more conductive. This results in the reference output voltage at node 379 reaching a maximum value and causes the hysteresis of the buffer to increase to a maximum amount. Similarly, when the buffer is operating under a low noise condition, the voltages at nodes 370 and 376 increase which causes n-channel MOSFET 382 to be more conductive and p-channel MOSFET 378 to be less conductive. This results in the reference output voltage at node 379 reaching a minimum value and causes the hysteresis of the buffer to reduce to a minimum amount. In addition, the reference voltage generator of FIG. 9 produces intermediate reference voltages at node 379 when the buffer is operating under noise conditions intermediate of the high and low noise operating conditions (e.g. low power supply voltage, hot temperatures and fast transistor parameters or high power supply voltage, hot temperatures and fast transistor parameters). As temperature increases and operating conditions become less noisy, the floating voltage source will produce increasing voltages at nodes 370 and 376, driving the output reference voltage VREF down and decreasing hysteresis of the buffer. As temperature decreases and operating conditions become more noisy, the floating voltage source will produce decreasing voltages at nodes 370 and 376, driving the output reference voltage VREF up and increasing hysteresis of the buffer.

It will be appreciated that for the embodiments of the present invention illustrated in FIGS. 3, 5, 7, and 12, reference voltage generators illustrated in FIG. 8 and FIG. 9 may be altered to provide a low output voltage when a high noise condition is present, a high output voltage when a low noise condition is present, and a one or more intermediate voltages when intermediate noise conditions are present in the buffer.

Figure 10:
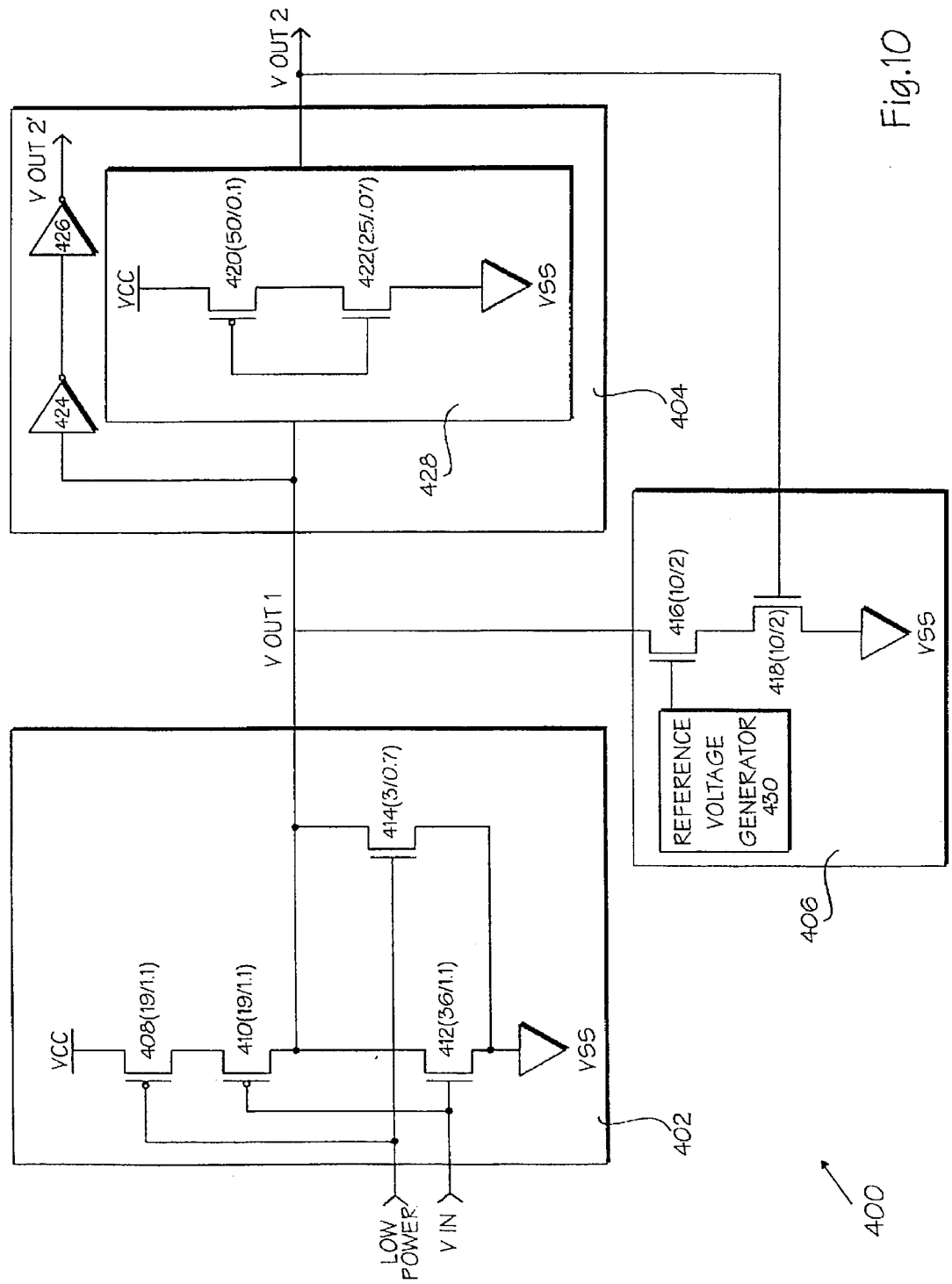
FIG. 10 illustrates a preferred embodiment of the buffer with modulated hysteresis configured in accordance with the present invention.

Referring to FIG. 10, a preferred embodiment of the present invention is illustrated. A buffer 400 comprises a first stage switching element 402 having a first DC trip point, a second stage switching element 404 having a second DC trip point and a hysteresis control element 406. The first stage switching element 402 comprises a CMOS NOR gate with input signals VIN and LOW POWER, and output VOUT1. Specifically, the CMOS NOR gate 402 contains two p-channel MOSFETs 408 and 410 coupled to two n-channel MOSFETs 412 and 414 such that when the LOW POWER signal is at a low logic level the output voltage at VOUT1 will be the inverse of the input voltage VIN. The LOW POWER signal is provided to reduce the stand-by current of the buffer to a minimum when the buffer is inactive. This is accomplished by activating the LOW POWER signal (applying a high logic level to the LOW POWER input signal). The second stage switching element 404 is coupled to the CMOS NOR gate 402 and comprises CMOS inverters 424, 426 and 428. CMOS inverter 424 and 426 are current buffers which are coupled in series and produce output signal VOUT2' from signal VOUT1. CMOS inverter 428 contains p-channel MOSFET 420 coupled to n-channel MOSFET 422 and produces output voltage VOUT2 which is the inverse of signal VOUT1. VOUT2 is coupled to the hysteresis control element 406.

Hysteresis control element 406 comprises two n-channel MOSFETs 416 and 418 coupled in series, in any order, to form a serial connection. The serial connection couples VOUT1 to VSS. In addition, the hysteresis control element 406 comprises a reference voltage generator 430 coupled to the gate of n-channel MOSFET 416. Reference voltage generator 430 controls the conductance of n-channel MOSFET 416. The output signal VOUT2 is coupled to and controls the gate of n-channel MOSFET 418, such that when both n-channel MOSFETs 416 and 418 are conductive, a feedback path exists and hysteresis is provided for buffer 400.

The sizes of the n-channel MOSFETs 412, 414, 416, 418 and 422 and the p-channel MOSFETs 408, 410 and 420 are selected based on a predetermined amount of hysteresis desired for a particular nominal operating condition (i.e. when the power supply voltage, the operating temperature and the transistor parameters are all nominal values, that is, neither a minimum nor a maximum). In a preferred embodiment of the present invention, p-channel MOSFETs 408 and 410 are constructed to have channel width/length ratios, in microns, of 19/1.1, p-channel MOSFET 420 is constructed to have a channel width/length ratio, in microns, of 50/0.8, n-channel MOSFET 414 is constructed to have a channel width/length ratio, in microns, of 3/0.7, n-channel MOSFETs 416 and 418 are constructed to have channel width/length ratios, in microns, of 10/2, and n-channel MOSFET 422 is constructed to have a channel width/length ratio, in microns, of 25/0.7.

For purposes of explanation, assume that the LOW POWER signal is inactive (at logic low level) biasing p-channel MOSFET 408 into saturation and n-channel MOSFET 414 into cutoff such that the CMOS NOR gate will invert signal VIN. With signal VIN initially residing at a low logic level or zero volts, p-channel MOSFET 410 is in saturation and n-channel MOSFET 412 is cutoff and VOUT1 will rise to a high logic level or approximately VCC (+5 volts). With VOUT1 at a high logic level, CMOS inverter 404 will produce a low logic level at VOUT2 which biases n-channel MOSFET 418 into cutoff. With n-channel MOSFET cutoff, there is no current path from VOUT1 to VSS thus eliminating the feedback path. As VIN increases from a low logic level to a high logic level, the output node VOUT1 will transition from a high logic level to a low logic level and subsequently CMOS inverter 404 will transition VOUT2 from a low logic level to a high logic level. VOUT1 will transition when VIN reaches the first DC trip point of CMOS NOR gate 402. Similarly, VOUT2 will transition when VOUT1 reaches the second DC trip point of CMOS inverter 428. With VOUT2 a high logic level, n-channel MOSFET 418 will be biased into saturation. If n-channel MOSFET 416 is biased by reference voltage generator 430 into either linear or saturation mode, then a feedback path will exist which will enable hysteresis control element 406 to generate a low logic level at VOUT1. As VIN now transitions back from the high logic level to the low logic level it will cause VOUT1 to transition from a low logic level to a high logic level. However, as VIN reaches the first DC trip point of CMOS NOR gate 402, the feedback path continues to generate a voltage at VOUT1 which is less than the second DC trip point of the CMOS inverter 404. Therefore, VIN must be reduced to a voltage below the first DC trip point of CMOS NOR gate 402 in order to drive VOUT1 above the second DC trip point of CMOS inverter 404 which will then transition VOUT2 to a low logic level and bias n-channel MOSFET 418 into cutoff. Once n-channel MOSFET is in cutoff, the feedback path is eliminated and VOUT1 stabilizes at a high logic level. The amount that VIN is offset from the first DC trip point of CMOS NOR gate 402 is the hysteresis amount of the buffer.

When the buffer is operating under a high noise condition, reference voltage generator 430 provides a high voltage sufficient to bias n-channel MOSFET 416 into saturation thus providing the highest conductive path is series with n-channel MOSFET 418. Thus when n-channel MOSFETs 416 and 418 are both in saturation, a high conductance current path exists between VOUT1 and VSS. Under this operating condition, VIN will be offset from the first DC trip point of the CMOS NOR gate 402 a maximum amount as VIN transitions from a high logic level to a low logic level. That is, hysteresis in the buffer will be a maximum amount.

Similarly, when the buffer is operating under a low noise condition, reference voltage generator 430 provides a low voltage sufficient to bias n-channel MOSFET 416 into cutoff thus providing a low conductance path is series with n-channel MOSFET 418. Thus when n-channel MOSFET 416 is cutoff, a low conductance current path exists between VOUT1 and VSS. In this instance, VIN will be offset from the first DC trip point of the CMOS NOR gate 402 a minimum amount as VIN transitions from a high logic level to a low logic level. That is, hysteresis in the buffer will be a minimum amount or essentially eliminated. Additionally, when the buffer is operating under an intermediate noise condition, reference voltage generator 430 provides an intermediate voltage to n-channel MOSFET 416 that is intermediate of the high and low voltages produced under high and low noise operating conditions. The intermediate voltage varies such that it controls the conductance of n-channel MOSFET 416 (moving it from cutoff to saturation)..For example, when the buffer is operating under a high power supply voltage (VCC), hot temperatures and fast transistor parameters, the reference voltage generator may provide a voltage which biases n-channel MOSFET into the linear region of operation. Thus VIN will be offset from the first DC trip point of the CMOS NOR gate 402 an amount less than that of the high noise operating condition, and greater than that of the low noise operating condition and hysteresis will be at an intermediate amount in the buffer.

Figure 2:
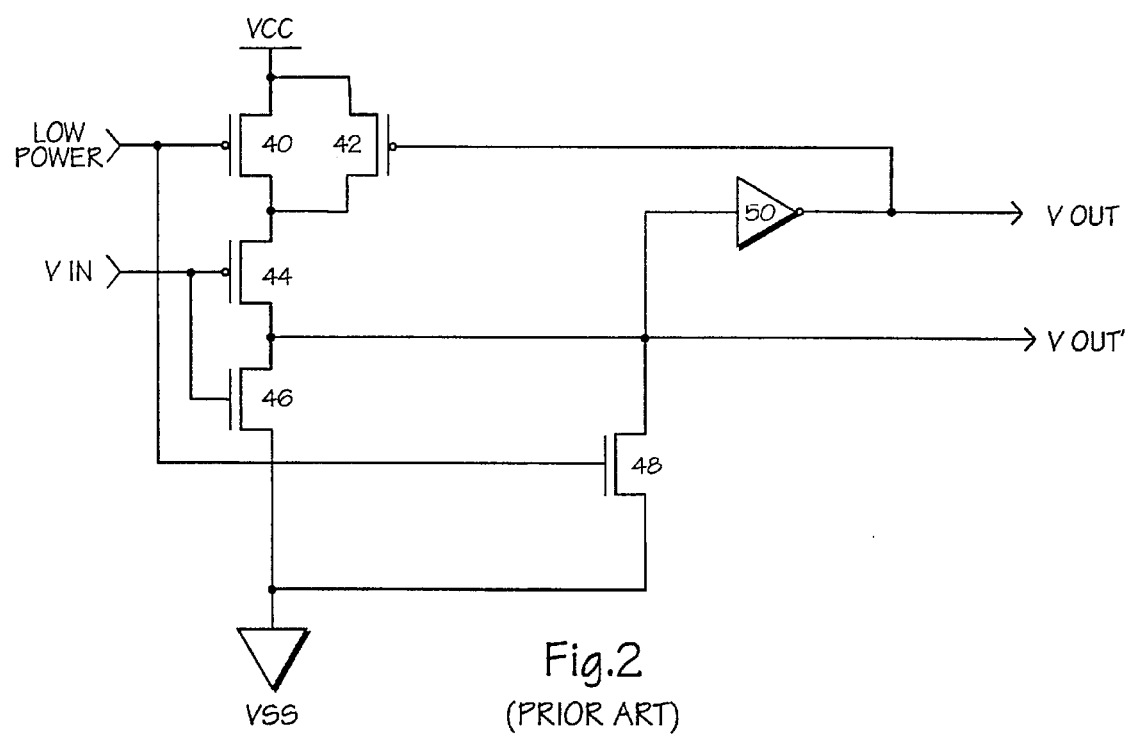
FIG. 2 illustrates a prior art Schmitt Trigger circuit diagram.
Figure 15:
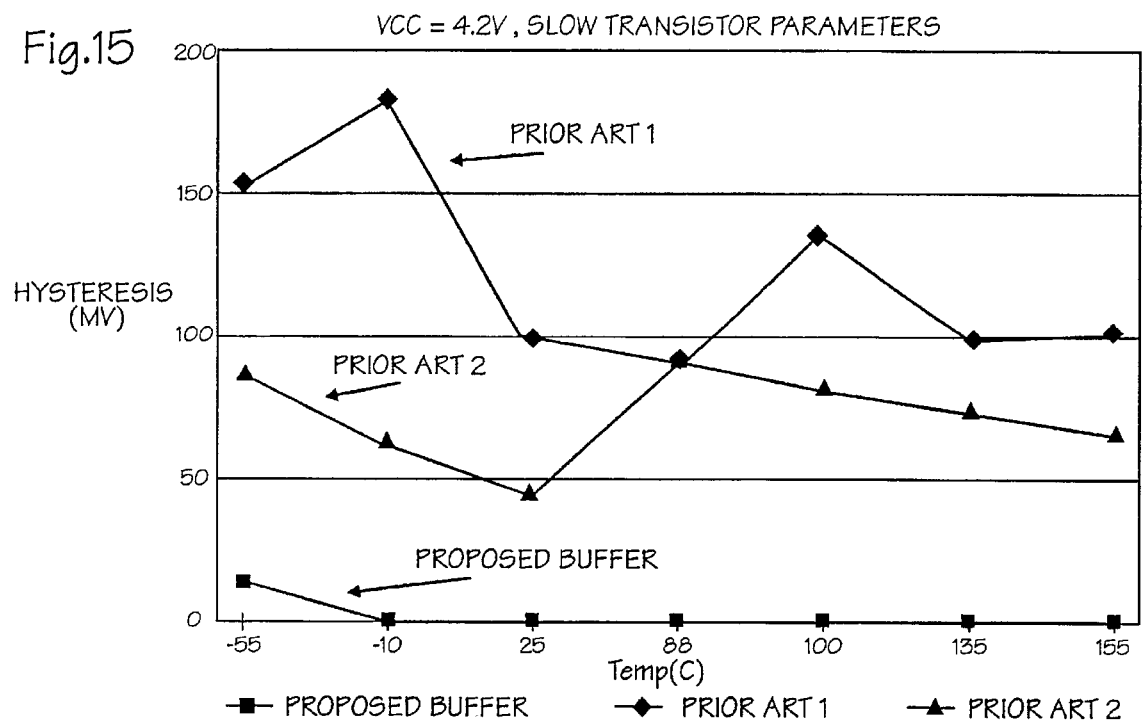
FIG. 15 is a graph which illustrates the amount of hysteresis present in the circuit diagrams of FIGS. 1, 2 and 10 as a function of temperature when the circuits operate at low power supply voltage and slow transistor parameters.
Figure 16:
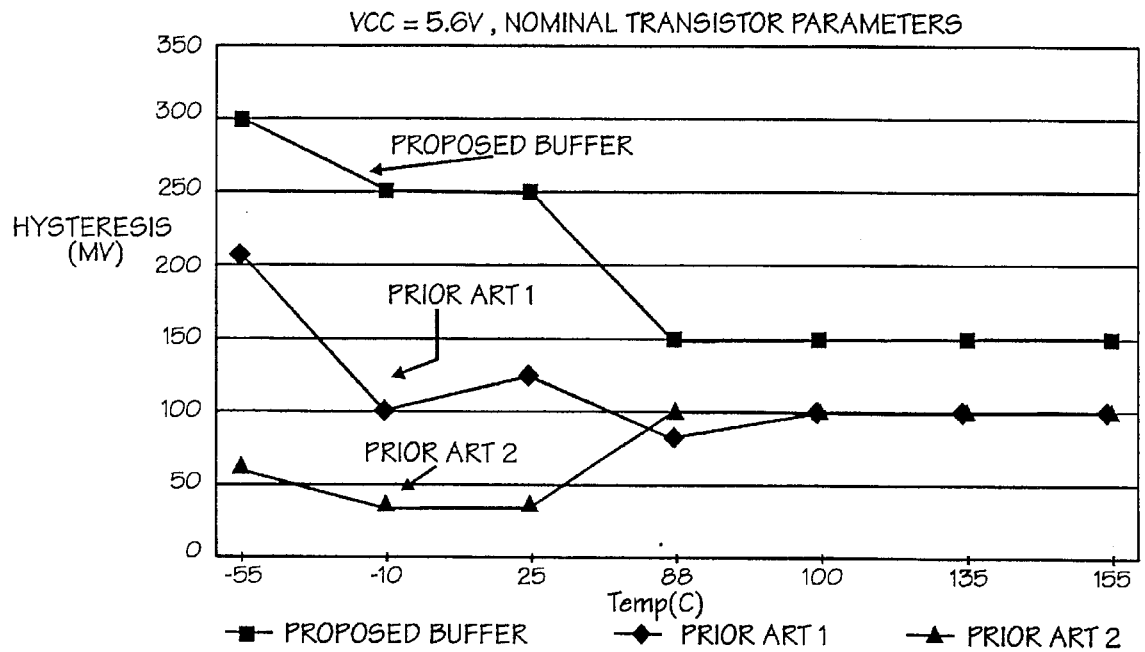
FIG. 16 is a graph which illustrates the amount of hysteresis present in the circuit diagrams of FIGS. 1, 2 and 10 as a function of temperature when the circuits operate at high power supply voltage and nominal transistor parameters.
Figure 17:
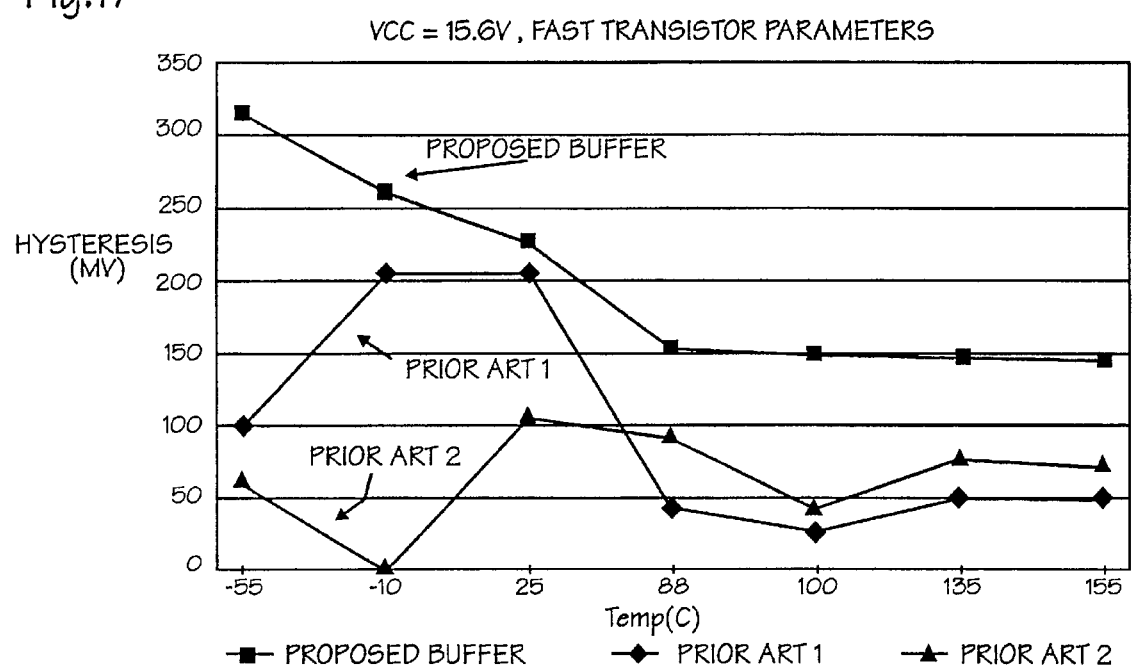
FIG. 17 is a graph which illustrates the amount of hysteresis present in the circuit diagrams of FIGS. 1, 2 and 10 as a function of temperature when the circuits operate at high power supply voltage and fast transistor parameters.
Figure 18:
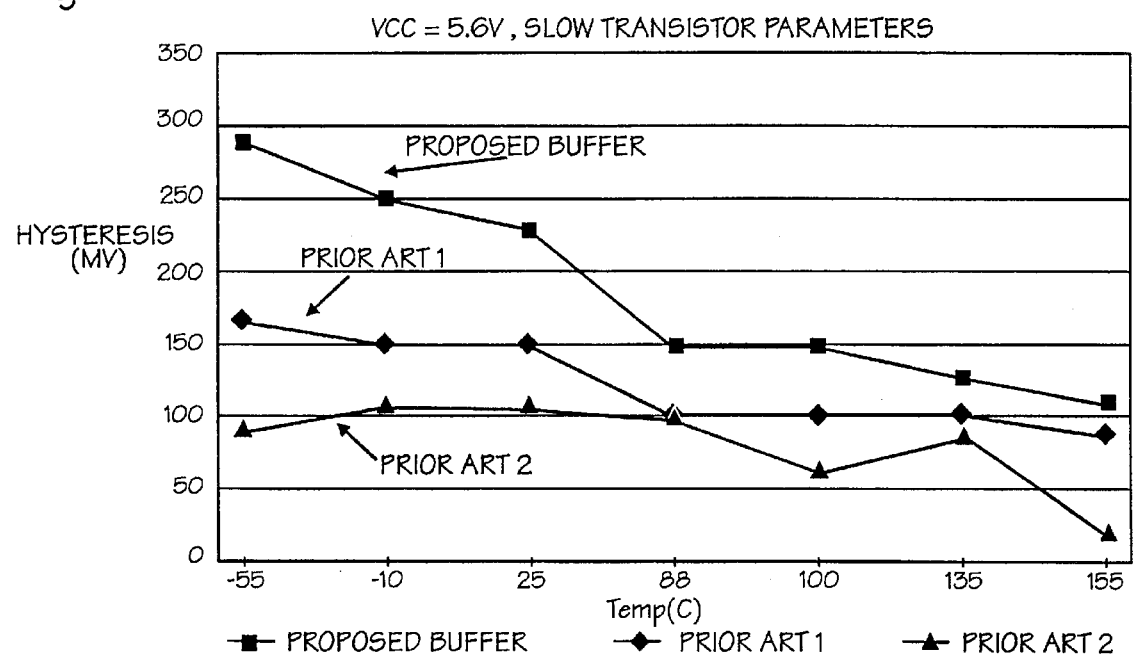
FIG. 18 is a graph which illustrates the amount of hysteresis present in the circuit diagrams of FIGS. 1, 2 and 10 as a function of temperature when the circuits operate at high power supply voltage and slow transistor parameters.

FIGS. 13–18 illustrate hysteresis characteristics of tests performed on the preferred embodiment of the present invention as a function of operating conditions. The operating conditions comprise combinations of power supply voltages and transistor parameters spread over a temperature range of –55° C. to +155° C. The preferred embodiment of the present invention is compared against the prior art buffers with hysteresis of FIGS. 1 and 2 under the same operating conditions. FIGS. 13, 14, 16 and 18 illustrate various intermediate operating conditions, FIG. 15 illustrates a low noise operating condition and FIG. 17 illustrates a high noise operating condition. It will be appreciated that the test data illustrated in FIGS. 13–18 are for illustration purposes and are not to be interpreted as affirmations that the test conditions constitute the operation extremes of the present invention.

FIGS. 13–18 show that the preferred embodiment of the present invention exhibits increasing hysteresis values as temperature decreases (noise conditions worsen) under each test condition. In contrast, the prior art circuits do not produce an increasing trend in the amount of hysteresis generated by the circuits as noise conditions worsen. In addition, FIG. 15 shows that at the lowest noise operating condition tested (+155° C., VCC=4.2 V, slow transistor parameters), the hysteresis of the preferred embodiment of the present invention is zero, while the hysteresis of the Prior Art 1 and Prior Art 2 are approximately 70 mV and 100 mV respectively. Thus, unlike the present invention, Prior Art 1 and Prior Art 2 will continue to introduce a hysteresis delay into their buffer circuits under operating conditions where hysteresis is not required. Furthermore, FIG. 17 shows that at the highest noise operating condition tested (–55° C., VCC=5.6 V, fast transistor parameters), the hysteresis of the preferred embodiment of the present invention reaches a maximum value of approximately 320 mV, while the hysteresis of the Prior Art 1 and Prior Art 2 are approximately 100 mV and 60 mV respectively. Thus, unlike the present invention, Prior Art 1 and Prior Art 2 will generate amounts of hysteresis in their respective circuits which are not a maximum amount at a high noise condition, which is when hysteresis is needed most in a buffer.

Figure 11:
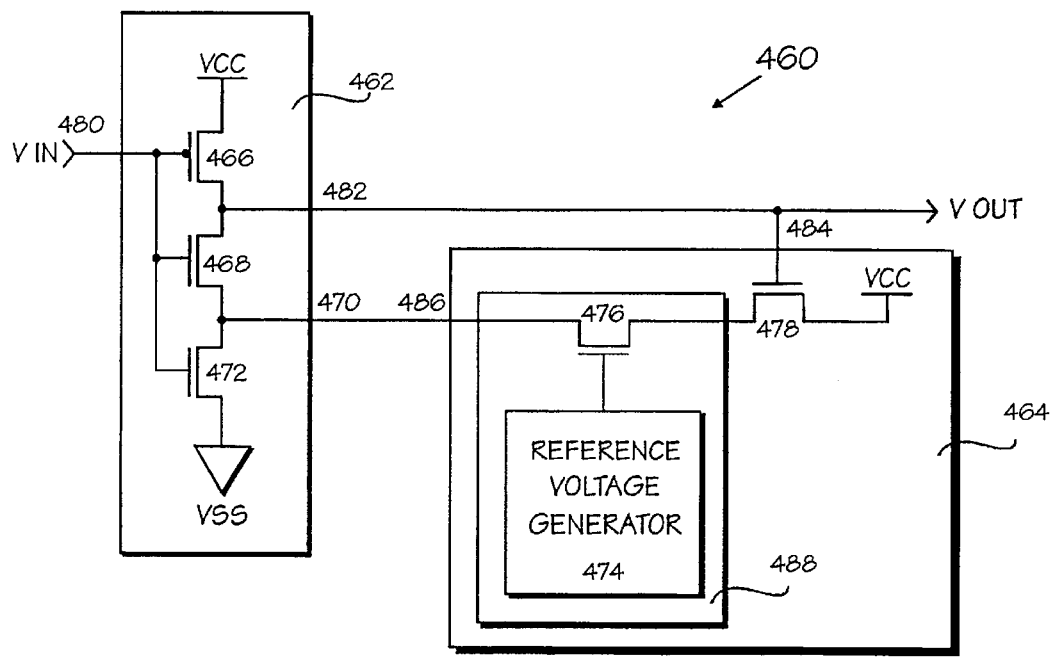
FIG. 11 illustrates a seventh embodiment of the buffer with modulated hysteresis.

Referring to FIG. 11, a seventh embodiment of the present invention is illustrated. The buffer 460 comprises a first stage switching element 462 having a DC trip point and a hysteresis control element 464. The first stage switching element has three terminals: an input terminal 480, an output terminal 482 and a bias terminal 470. The input terminal 480 receives an input signal VIN to the buffer. The output terminal 482 produces a signal which is the inverse of the input signal VIN. The bias terminal 470 is coupled to the hysteresis control element 464. The first stage switching element may comprise any digital switching circuitry such as a NOR gate or an inverter. FIG. 11 illustrates the first stage switching element as comprising a CMOS inverter having p-channel MOSFET 466 coupled to n-channel MOSFETs 468 and 472. It will be appreciated that the first stage switching element may also comprise a LOW POWER signal as an additional input which, when active, biases the buffer into a standby-by mode to reduce current consumption.

The hysteresis control element 464 has a first and second terminal. The first terminal 484 is coupled to the output terminal 482 of the first stage switching element 462. The second terminal 486 is coupled to the bias terminal 470. As in the previous embodiments, the hysteresis control element provides a feedback path which controls and modulates hysteresis in the buffering response to variations in the operating conditions of the buffer. In particular, when the buffer is operating trader a high noise condition, the hysteresis control element provides the buffer with a maximum amount of hysteresis. When the buffer is operating under a low noise condition, the hysteresis control element provides the buffer with a minimum amount of hysteresis. Alternatively, when the buffer is operating under an intermediate noise condition, the hysteresis control element, in addition to being able to provide maximum and minimum amounts of hysteresis, will provide the buffer with an intermediate mount of hysteresis.

The hysteresis control element 464 comprises a hysteresis modulation element 488 coupled in series to a second stage switching element 478. The second stage switching 478 illustrated in FIG. 11 comprises an n-channel MOSFET. The gate of the n-channel MOSFET 478 is coupled the first terminal 484 and is controlled by the output terminal 482 of the first stage switching element 462. The hysteresis modulation element 488 comprises a third stage switching element 476 coupled to a reference voltage generator 474. The third stage switching element illustrated in FIG. 11 comprises an n-channel MOSFET 476 which is coupled in series with n-channel MOSFET 478 to form a serial connection. The serial connection couples reference voltage VCC to the bias terminal 470. The reference voltage generator 474 is coupled to and controls the conductance of the n-channel MOSFET 476. It will also be appreciated that the hysteresis modulation element 488 may alternatively comprise a switch. When the buffer is operating under a high noise condition, the switch is closed to provide a high conductance path series with n-channel MOSFET 478 and generate a maximum amount of hysteresis in the buffer. Similarly, when the buffer is operating under a low noise condition, the switch would open providing a low conductance path in series with n-channel MOSFET 478 generating a minimum amount of hysteresis in the buffer.

In operation, with signal VIN initially residing at a high logic level or approximately VCC (+5 volts), p-channel MOSFET 466 is cutoff and n-channel MOSFETs 468 and 472 are in saturation. Under this condition, VOUT will be a low logic level or approximately zero volts. With VOUT1 at a low logic level, n-channel MOSFET 478 is biased into cutoff and there is no feedback path. As VIN decreases from a high logic level to a low logic level, VOUT will transition from a low logic level to a high logic level when VIN reaches the DC trip point of CMOS inverter 462. With VOUT a high logic level, n-channel MOSFET 478 will be biased into saturation. If n-channel MOSFET 476 is biased by reference voltage generator 474 into either linear or saturation mode, then a feedback path will exist which will enable hysteresis control element 464 to generate a voltage at bias terminal 470. As VIN now transitions back from the low logic level to the high logic level n-channel MOSFET 468 will not turn on until the difference between VIN and the voltage applied at the bias terminal by the hysteresis control element 464 is greater than the threshold voltage of n-channel MOSFET 468. Thus, when VIN increases to the DC trip point of the CMOS inverter 462 the inverter will not transition; rather, VIN must increase to a level greater than the DC trip point of the CMOS inverter 462 to bring VOUT to a low logic level and cutoff n-channel MOSFET 478 eliminating the feedback path. The amount that VIN is offset from the DC trip point of CMOS inverter 462 is the amount of hysteresis in the buffer.

When the buffer is operating under a high noise condition, reference voltage generator 474 provides a high voltage sufficient to bias n-channel MOSFET 476 into saturation thus providing a high conductive path is series with n-channel MOSFET 478 and generating a high voltage at bias terminal 470. Thus when n-channel MOSFETs 476 and 478 are both in saturation, a high conductance path exists between VCC and the bias terminal 470 which will offset the transition point of CMOS inverter 462 from its DC trip point a maximum amount as VIN transitions from a low logic level to a high logic level. That is, hysteresis in the buffer will be at a maximum amount. Similarly, when the buffer is operating under a low noise condition, reference voltage generator 474 provides a low voltage sufficient to bias n-channel MOSFET 476 into cutoff thus providing a low conductance path is series with n-channel MOSFET 478. Thus when n-channel MOSFET is cutoff, a low conductance current path exists between VCC and bias terminal 470. In this instance, VIN will be offset from the DC trip point of the CMOS inverter 462 a minimum amount as VIN transitions from a low logic level to a high logic level. That is, hysteresis in the buffer will be at a minimum amount or essentially eliminated. Additionally, when the buffer is operating under an intermediate noise condition, reference voltage generator 474 provides a voltage to n-channel MOSFET 476 that is intermediate of the high and low voltages produced under high and low noise operating conditions. The intermediate voltage varies such that it controls the conductance of n-channel MOSFET 476 (moving it from cutoff to saturation). For example, when the buffer is operating under a high power supply voltage (VCC), hot temperatures and fast transistor parameters, the reference voltage generator may provide a voltage which biases n-channel MOSFET into the linear region of operation. Thus VIN will be offset from the DC trip point of the CMOS inverter 462 an amount less than that of the high noise operating condition, and greater than that of the low noise operating condition and hysteresis will be at an intermediate amount in the buffer.

Figure 12:
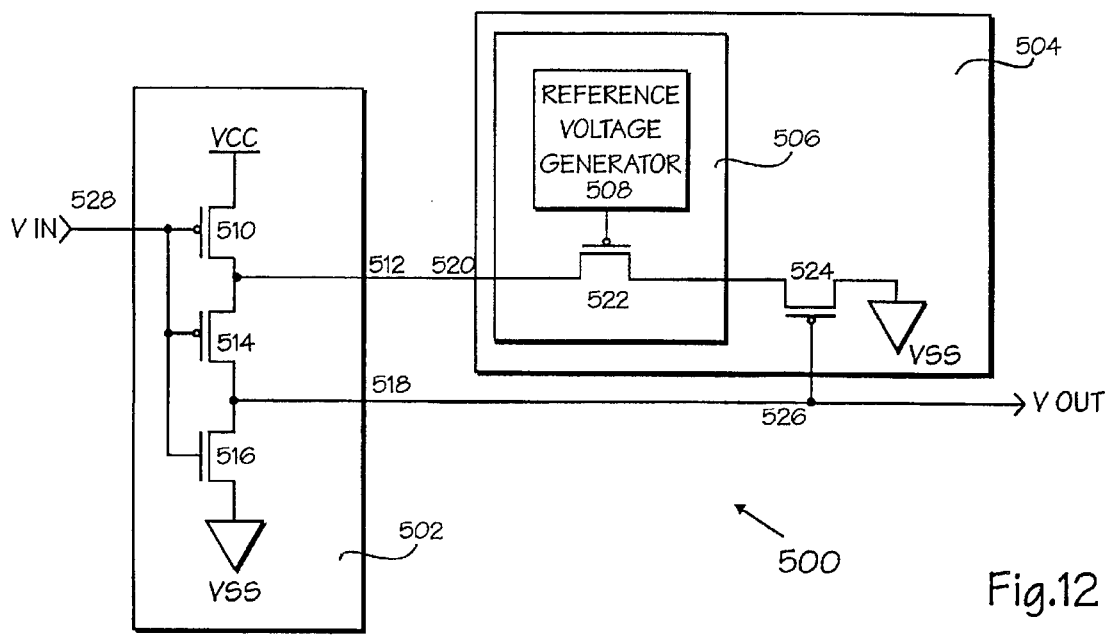
FIG. 12 illustrates an eighth embodiment of the buffer with modulated hysteresis.

Referring now to FIG. 12, an eighth embodiment of the present invention is illustrated. The buffer 500 is similar to the that illustrated in FIG. 11 except that the hysteresis control element 504 comprises a second stage switching element 524 coupled to the hysteresis modulation element 506. The hysteresis modulation element 506 comprises a third stage switching element 522 coupled to a reference voltage generator 508. The second and third stage switching elements 524 and 522 illustrated in FIG. 12 comprise p-channel MOSFETs. The p-channel MOSFET 524 is coupled to and controlled by the first stage switching element 502, while the gate of p-channel MOSFET 522 is coupled to and controlled by the reference voltage generator 508. The operation of the buffer 500 is analogous to buffer 460 of FIG. 11 except that hysteresis is generated as VIN transitions from a high logic level to a low logic level after transitioning from a low logic level to a high logic level.

Although the present invention has been described in terms of a preferred embodiment, it will be appreciated that various modifications and alterations might be made by those Skilled in the art without departing from the spirit and scope of the invention. The invention should therefore be measured in terms of the claims which follow.

I claim:

1. A buffer having hysteresis varying with noise operating conditions, said buffer comprising:

a first stage switching element; and a hysteresis control element coupled to said first stage switching element such that said hysteresis control element varies the hysteresis of said buffer in response to variations in said noise operating conditions, wherein said noise operating conditions comprise a first noise operating condition, a second noise operating condition and at least one intermediate noise operating condition, and wherein when said buffer is operating under said first noise operating condition said hysteresis control element increases the hysteresis of said buffer to a maximum hysteresis value, wherein when said buffer is operating under said second noise operating condition said hysteresis control element reduces the hysteresis of said buffer to a minimum hysteresis value, wherein when said buffer is operating under said at least one intermediate noise operating condition said hysteresis control element modulates the hysteresis of said buffer to a value intermediate between said minimum and maximum hysteresis values.

2. The buffer of claim 1 wherein said first stage switching element comprises a low power terminal, said low power terminal coupled to a low power signal such that when said low power signal is active current flow through said current path is reduced to a minimum.

3. The buffer of claim 2 wherein said first stage switching element having an input, an output and a bias terminal, wherein said hysteresis control element couples the output of the first stage switching element to the bias terminal of said first stage switching element.

4. The buffer of claim 3 wherein said hysteresis control element comprises a hysteresis modulation element with variable conductance coupled in series with a second stage switching element, said output of said first stage switching element coupled to said second stage switching element, said hysteresis modulation element coupled to the bias terminal of said first stage switching element, wherein when said buffer is operating under said first noise operating condition said hysteresis modulation element couples a high conductance path in series with said second stage switching element, wherein when said buffer is operating under said second noise operating condition said hysteresis modulation element couples a low conductance path in series with said second stage switching element.

5. The buffer of claim 4 wherein when said buffer is operating under said at least one intermediate noise operating condition said hysteresis modulation element couples an intermediate conductance path in series with said second stage switching element.

6. The buffer of claim 3 wherein said hysteresis control element comprises:

a second stage switching element coupled to the output of said first stage switching element;

a third stage switching element having variable conductance and coupling said second stage switching element to said bias terminal of said first stage switching element; and a reference voltage generator coupled to said third stage switching element, said reference voltage generator controlling the variable conductance of said third stage switching element;

wherein when said buffer is operating under said first noise operating condition the reference voltage generator couples a first voltage to said third stage switching element, said first voltage causing said third stage switching element to couple a high conductance path in series with said second stage switching element, wherein when said buffer is operating under said second noise operating condition the reference; voltage generator couples a second voltage to said third stage switching element, said second voltage causing said third stage switching element to couple a low conductance path in series with said second stage switching element.

7. The buffer of claim 6 wherein when said buffer is operating under said at least one intermediate noise operating condition the reference voltage generator couples at least one third voltage to said third stage switching element, wherein said at least one third voltage is intermediate between said first and said second voltages, said at least one third voltage causing said third stage switching element to couple an intermediate conductance path in series with said second stage switching element.

8. The buffer of claim 6 wherein said reference voltage generator comprises:

(a) a first voltage generator circuit producing an output voltage;

(b) a second voltage generator circuit producing said reference voltage, wherein said second voltage generator is coupled to said first voltage generator to receive said output voltage;

(c) wherein each of said voltage generator circuits comprises:

(i) a first set of transistors having a first conductance parameter; and (ii) a second set of transistors having a second conductance parameter; and (d) a feedback path coupled to said first and second voltage generator circuits, wherein said feedback path compensates for uncontrolled variations in said reference voltage caused by variations between said first conductance parameter and said second conductance parameter.

9. The buffer of claim 8 wherein said reference voltage generator further comprises a floating voltage source connected to at least one of said first voltage generator circuit and said second voltage generator circuit, said floating voltage source having a temperature coefficient that enables said floating voltage source to increase the reference voltage generator's temperature dependence in a controlled fashion.

10. The buffer of claim 6 wherein said reference voltage generator comprises voltage generator circuit producing an output voltage and a floating voltage source coupled to said voltage generator circuit, said floating voltage source having a temperature coefficient that enables said floating voltage source to increase the reference voltage generator's temperature dependence in a controlled fashion.

11. A buffer of claim 3 wherein said first stage switching element comprises a DC trip point, wherein the hysteresis control element couples a first voltage to thee bias terminal of said first 4 stage switching element as an input voltage applied to the input of said first stage switching element transitions from a first logic state to a second logic state, said first stage switching element transitioning as said input voltage reaches said DC trip point;

wherein said hysteresis control element couples a second voltage to the bias terminal of said first stage switching element as said input voltage transitions from said second logic state to said DC trip point, said second voltage offset from said DC trip point such that said first stage switching element does not transition;

wherein said hysteresis control element couples a third voltage to the bias terminal of said first stage switching element as said input voltage transitions from said DC trip point to said first logic state, said first stage switching element transitioning as said input voltage reaches an offset voltage level, said offset voltage level offset from said DC trip point;

wherein the difference between said offset voltage level and said DC trip point varies in response to said noise operating conditions.

12. The buffer of claim 11 wherein the difference between said offset voltage level and said DC trip point is a maximum value when said buffer is operating under said first noise operating condition, wherein the difference between said offset voltage level and said DC trip point is a minimum value when said buffer is operating under said second noise operating condition.

13. The buffer of claim 12 wherein the difference between said offset voltage level and said DC trip point is a value intermediate between said maximum value and said minimum value when said buffer is operating under said at least one intermediate noise operating condition.

14. The buffer of claim 11 further comprising a second stage switching element, said second stage switching element coupled to said hysteresis control element and said first stage switching element such that a transition in said first stage switching element results in a transition of said second stage switching element.

15. The buffer of claim 14 wherein said first stage switching element comprising an input and an output, said second stage switching element comprising an input and an output, said output of said first stage switching element is coupled to the input of said second stage switching element, wherein said hysteresis control element couples the output of the first stage switching element to the output of said second stage switching element.

16. The buffer of claim 15 wherein said hysteresis control element comprises a hysteresis modulation element with variable conductance coupled in series with a third stage switching element forming a serial connection, said output of said second stage switching element coupled to said third stage switching element, said serial connection coupling the output of said first stage switching element to a reference voltage, wherein when said buffer is operating under said first noise operating condition said hysteresis modulation element couples a high conductance path in series with said third stage switching element, wherein when said buffer is operating under said second noise operating condition said hysteresis modulation element couples a low conductance path in series with said third stage switching element.

17. The buffer of claim 16 wherein when said buffer is operating under said at least one intermediate noise operating condition said hysteresis modulation element couples an intermediate conductance path in series with said third stage switching element.

18. The buffer of claim 15 wherein said hysteresis control element comprises:

a third stage switching element coupled to the output of said second stage switching element;

a fourth stage switching element having variable conductance coupled in series with said third stage switching element forming a serial connection, said serial connection coupling the output of said first stage switching element to a reference voltage; and:

a reference voltage generator coupled to said fourth stage switching element, said reference voltage generator controlling the variable conductance of said fourth stage switching element;

wherein when said buffer is operating under said first noise operating condition the reference voltage generator couples a first voltage to said fourth stage switching element, said first voltage causing said fourth stage switching element to couple a high conductance path in series with said third stage switching element, wherein when said buffer is operating under said second noise operating condition the reference voltage generator couples a second voltage to said fourth stage switching element, said second voltage causing said fourth stage switching element to couple a low conductance path in series with said third stage switching element.

19. The buffer of claim 18 wherein when said buffer is operating under said at least one intermediate noise operating condition the reference voltage generator couples at least one third voltage to said fourth stage switching element, wherein said at least one third voltage is intermediate between said first and said second voltages, said at least one third voltage causing said fourth stage switching element to couple an intermediate conductance path in series with said third stage switching element.

20. The buffer of claim 18 wherein said reference voltage generator comprises:

(a) a first voltage generator circuit producing an output voltage;

(b) a second voltage generator circuit producing said reference voltage, wherein said second voltage generator is coupled to said first voltage generator to receive said output voltage;

(c) wherein each of said voltage generator circuits comprises:

(i) a first set of transistors having a first conductance parameter; and (ii) a second set of transistors having a second conductance parameter; and (d) a feedback path coupled to said first and second voltage generator circuits, wherein said feedback path compensates for uncontrolled variations in said reference voltage caused by variations between said first conductance parameter and said second conductance parameter.

21. The buffer of claim 20 wherein said reference voltage generator further comprises a floating voltage source connected to at least one of said first voltage generator circuit and said second voltage generator circuit, said floating voltage source having a temperature coefficient that enables said floating voltage source to increase the reference voltage generator's temperature dependence in a controlled fashion.

22. The buffer of claim 18 wherein said reference voltage generator comprises voltage generator circuit producing an output voltage and a floating voltage source coupled to said voltage generator circuit, said floating voltage source having a temperature coefficient that enables said floating voltage source to increase the reference voltage generator's temperature dependence in a controlled fashion.

23. A buffer of claim 15 wherein said first stage switching element comprises a first DC trip point and said Second stage switching element comprises a second DC trip point, wherein the hysteresis control element generates a first voltage at the output of the first stage switching element as an input voltage applied to the first stage switching element transitions from a first logic state to a second logic state thus transitioning the second stage switching element at said second DC trip point, said first stage switching element transitioning as said input voltage reaches said first DC trip point;

wherein said hysteresis control element generates a second voltage at the output of said first stage switching element as said input voltage transitions from said second logic state to said first DC trip point, said second voltage offset from said second DC trip point such that said second stage switching element does not transition;

wherein said hysteresis control element generates a third voltage at the output of said first stage switching element as said input voltage transitions from said first DC trip point to said first logic state thus transitioning said second stage switching element, said first stage switching element transitioning as said input voltage reaches an offset voltage level, said offset voltage level offset from said first DC trip point;

wherein the difference between said offset voltage level and said first DC trip point varies in response to said noise operating conditions.

24. The buffer of claim 23 wherein the difference between said offset voltage level and said first DC trip point is a maximum value when said buffer is operating under said first noise operating condition, wherein the difference between said offset voltage level and said first DC trip point is a minimum value when said buffer is operating under said second noise operating condition.

25. The buffer of claim 24 wherein the difference between said offset voltage level and said first DC trip point is a value intermediate between said maximum value and said minimum value when said buffer is operating under said at least one intermediate noise operating condition.

26. The buffer of claim 16 wherein said first stage switching element comprises a low power terminal, said low power terminal coupled to a low power signal such that when said low power signal is active current flow through said current path is reduced to a minimum.

27. A method for varying hysteresis in response to variations in noise operating conditions in a buffer comprising a first stage switching element coupled to a hysteresis control element, said method comprising the steps of:

increasing the hysteresis of said buffer to a maximum hysteresis value when said noise operating conditions comprise a first noise operating condition;

reducing the hysteresis of said buffer to a minimum hysteresis value when said noise operating conditions comprise a second noise operating condition; and modulating the hysteresis of said buffer to an intermediate hysteresis value between said minimum and maximum hysteresis values when said noise operating conditions comprise at least one intermediate noise operating condition.

28. The method of claim 27 wherein said first stage switching element comprises an input, an output and a bias terminal.

29. The method of claim 28 wherein said hysteresis control element comprises a hysteresis modulation element with variable conductance coupled in series with a second stage switching element, said output of said first stage switching element coupled to said second stage switching element, said hysteresis modulation element coupled to the bias terminal of said first stage switching element, wherein when said buffer is operating under said first noise operating condition said hysteresis modulation element couples a high conductance path in series with said second stage switching element, wherein when said buffer is operating under said second noise operating condition said hysteresis modulation element couples a low conductance path in series with said second stage switching element.

30. The method of claim 29 wherein when said buffer is operating under said at least one intermediate noise operating condition said hysteresis modulation element couples an intermediate conductance path in series with said second stage switching element.

31. The method of claim 28 wherein said hysteresis control element comprises:

a second stage switching element coupled to the output of said first stage switching element;

a third stage switching element having variable conductance coupling said second stage switching element to said bias terminal of said first stage switching element; and a reference voltage generator coupled to said third stage switching element, said reference voltage generator controlling the variable conductance of said third stage switching element;

wherein when said buffer is operating under said first noise operating condition the reference voltage generator couples a first voltage to said third stage switching element, said first voltage causing said third stage switching element to couple a high conductance path in series with said second stage switching element, wherein when said buffer is operating under said second noise operating condition the reference voltage generator couples a second voltage to said third stage switching element, said second voltage causing said third stage switching element to couple a low conductance path in series with said second stage switching element.

32. The method of claim 31 wherein when said buffer is operating under said at least one intermediate operating condition the reference voltage generator couples at least one third voltage to said third stage switching element, wherein said at least one third voltage is intermediate between said first and said second voltages, said at least one third voltage causing said third stage switching element to couple an intermediate conductance path in series with said second stage switching element.

33. The method of claim 27 further comprising a second stage switching element, said second stage switching element coupled to said hysteresis control element and said first stage switching element such that a transition in said first stage switching element results in a transition of said second stage switching element.

34. The method of claim 33 wherein said first stage switching element comprises an input and an output, said second stage switching element comprises an input and an output, said output of said first stage switching element coupled to the input of said second stage switching element, wherein said hysteresis control element couples the output of the first stage switching element to the output of said second stage switching element.

35. The method of claim 34 wherein said hysteresis control element comprises a hysteresis modulation element with variable conductance coupled in series with a third stage switching element to form a serial connection, said output of said second stage switching element coupled to said third stage switching element, said serial connection of said hysteresis modulation element and said third stage switching element coupling said output of said first stage switching element to a reference voltage, wherein when said buffer is operating under said first noise operating condition said hysteresis modulation element couples a high conductance path in series with said third stage switching element, wherein when said buffer is operating under said second noise operating condition said hysteresis modulation element couples a low conductance path in series with said third stage switching element.

36. The method of claim 35 wherein when said buffer is operating under said at least one intermediate noise operating condition said hysteresis modulation element couples an intermediate conductance path in series with said third stage switching element.

37. The method of claim 34 wherein said hysteresis control element comprises:

a third stage switching element;

a fourth stage switching element having a variable conductance, said fourth stage switching element coupled in series with said third stage switching element to form a serial connection, said output of said second stage switching element coupled to said third stage switching element, said serial connection coupling the output of said first stage switching element to a reference voltage; and a reference voltage generator coupled to said fourth stage switching element such that said reference voltage generator controls the variable conductance of said fourth stage switching element;

wherein when said buffer is operating under said first noise operating condition the reference voltage generator couples a first voltage to said fourth stage switching element, said first voltage causing said fourth stage switching element to couple a high conductance path in series with said third stage switching element, wherein when said buffer is operating under said second noise operating condition the reference voltage generator couples a second voltage to said fourth stage switching element, said second voltage causing said second stage switching element to couple a low conductance path in series with said third stage switching element.

38. The method of claim 37 wherein when said buffer is operating under said at least one intermediate noise operating condition the reference voltage generator couples at least one third voltage to said fourth stage switching element, wherein said at least one third voltage is intermediate between said first and said second voltages, said at least one third voltage causing said fourth stage switching element to couple an intermediate conductance path in series with said third stage switching element.

39. A method for varying hysteresis in response to variations in noise operating conditions in a buffer comprising a first stage switching element having a DC trip point, an input, an output and a bias terminal, and a hysteresis control element, said hysteresis control element coupling the said bias terminal to said output of said first stage switching element, said method comprising the steps of:

generating a first voltage at the bias terminal of the first stage switching element as an input voltage applied to the first stage switching element transitions from a first logic state to a second logic state;

transitioning said first stage switching element as said input voltage reaches said DC trip point;

generating a second voltage at the bias terminal of said first stage switching element as said input voltage transitions from said second logic state to said DC trip point, said second voltage offset from said DC trip point such that said first stage switching element does not transition;

generating a third voltage at the bias terminal of said first stage switching element as said input voltage transitions from said DC trip point to said first logic state;

transitioning said first stage switching element as said input voltage reaches an offset voltage level, said offset voltage level offset from said DC trip point, wherein the difference between said offset voltage level and said DC trip point varies in response to Said noise operating conditions;

reducing the hysteresis of said buffer to a minimum hysteresis value when said operating conditions comprise a first noise operating condition, wherein the difference between said offset voltage level and said DC trip point is a minimum value when said noise operating conditions comprise said first noise operating condition;

increasing the hysteresis of said buffer to a maximum hysteresis value when said operating conditions comprise a second noise operating condition, wherein the difference between said offset voltage level and said DC trip point is a maximum value when said noise operating conditions comprise said second noise operating condition; and modulating the hysteresis of said buffer to an intermediate hysteresis value between said minimum and maximum hysteresis values when said noise operating conditions comprise an intermediate noise operating condition, wherein the difference between said offset voltage level and said DC trip point is an intermediate value when said noise operating conditions comprise said intermediate noise operating condition intermediate between said first and second noise operating conditions.

40. A method for varying hysteresis in response to variations in noise operating conditions in a buffer comprising a first stage switching element having a first DC trip point, an input coupled to the output of said first stage switching element such that a transition and an output, a second stage switching element having a second DC trip point, an input and an output, the output of said second stage switching element in said first stage switching element results in a transition of said second stage switching element, and a hysteresis control element coupled to said first and second stage switching elements comprising the steps of:

generating a first voltage at the output of the first stage switching element as an input voltage applied to the first stage switching element transitions from a first logic state to a second logic state;

transitioning said first stage switching element as said input voltage reaches said first DC trip point and transitioning the second stage switching element at said second DC trip point;

generating a second voltage at the output of said first stage switching element as said input voltage transitions from said second logic state to said first DC trip point, said second voltage offset from said second DC trip point such that said second stage switching element does not transition;

generating a third voltage at the output of said first stage switching element as said input voltage transitions from said first DC trip point to said first logic state;

transitioning said first stage switching element as said input voltage reaches an offset voltage level, said offset voltage level offset from said first DC trip point, and subsequently transitioning said second stage switching element, wherein the difference between said offset voltage level and said first DC trip point varies in response to said noise operating conditions;

reducing the hysteresis of said buffer to a minimum hysteresis value when said operating conditions comprise a first operating condition, wherein the difference between said offset voltage level and said first DC trip point is a minimum value when said noise operating conditions comprise said first noise operating condition;

increasing the hysteresis of said buffer to a maximum hysteresis value when said operating conditions comprise a second operating condition; and modulating the hysteresis of said buffer to an intermediate hysteresis value between said minimum and maximum hysteresis values when said operating conditions comprise an intermediate noise operating condition, wherein the difference between said offset voltage level and said first DC trip point is an intermediate value when said noise operating conditions comprise said intermediate noise operating condition intermediate between said first and second noise operating conditions.

* * * * *